(12) United States Patent
Aoki et al.

(10) Patent No.: US 7,651,932 B2
(45) Date of Patent: Jan. 26, 2010

(54) METHOD FOR MANUFACTURING ANTENNA AND METHOD FOR MANUFACTURING SEMICONDUCTOR DEVICE

(75) Inventors: Tomoyuki Aoki, Atsugi (JP); Daiki Yamada, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 458 days.

(21) Appl. No.: 11/433,546

(22) Filed: May 15, 2006

(65) Prior Publication Data

US 2006/0270175 A1 Nov. 30, 2006

(30) Foreign Application Priority Data

May 31, 2005 (JP) ............................. 2005-158462

(51) Int. Cl.
*H01L 21/20* (2006.01)
*H01L 21/36* (2006.01)
(52) U.S. Cl. ...................................... 438/487; 438/795
(58) Field of Classification Search .................. 438/381, 438/487, 795
See application file for complete search history.

(56) References Cited

U.S. PATENT DOCUMENTS

| 6,846,696 | B2 | 1/2005 | Adachi et al. |
| 7,365,805 | B2 | 4/2008 | Maekawa et al. |
| 2004/0129450 | A1 | 7/2004 | Yamazaki et al. |
| 2006/0046512 | A1 | 3/2006 | Nakamura et al. |
| 2006/0143898 | A1* | 7/2006 | Kwak et al. .................... 29/600 |
| 2008/0246036 | A1 | 10/2008 | Yamazaki et al. |

FOREIGN PATENT DOCUMENTS

JP 2004-220591 8/2004

* cited by examiner

*Primary Examiner*—Thien F Tran
(74) *Attorney, Agent, or Firm*—Eric J. Robinson; Robinson Intellectual Property Law Office, P.C.

(57) ABSTRACT

The present invention provides an antenna with low resistance and a semiconductor device having an antenna whose communication distance is improved. A fluid containing conductive particles is applied over an object. After curing the fluid containing the conductive particles, the fluid is irradiated with a laser to form an antenna. As a method for applying the fluid containing the conductive particles, screen printing, spin coating, dipping, or a droplet discharging method is used. Further, a solid laser having a wavelength of 1 nm or more and 380 nm or less is used as the laser.

13 Claims, 17 Drawing Sheets

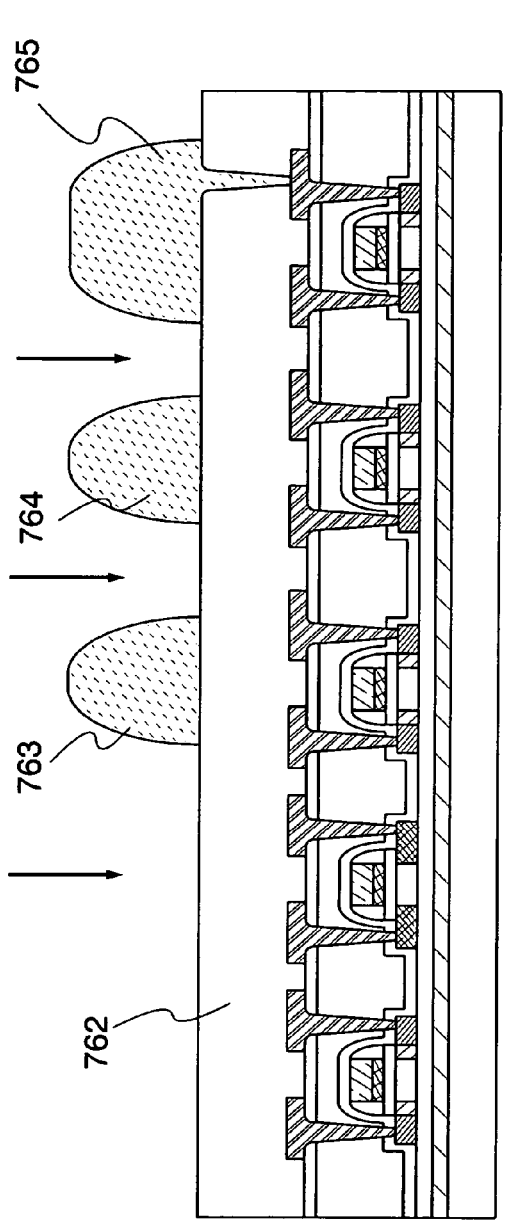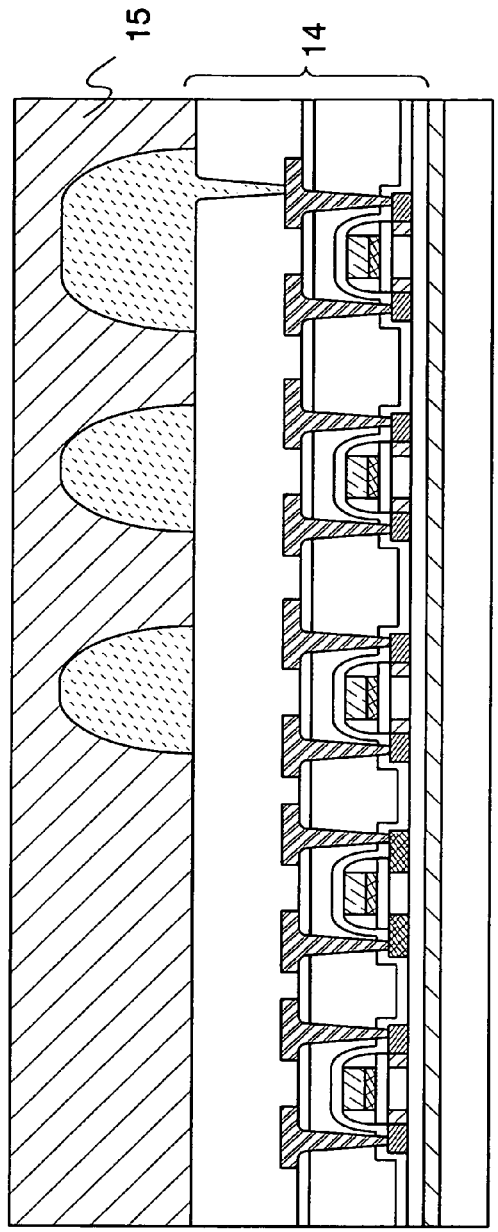

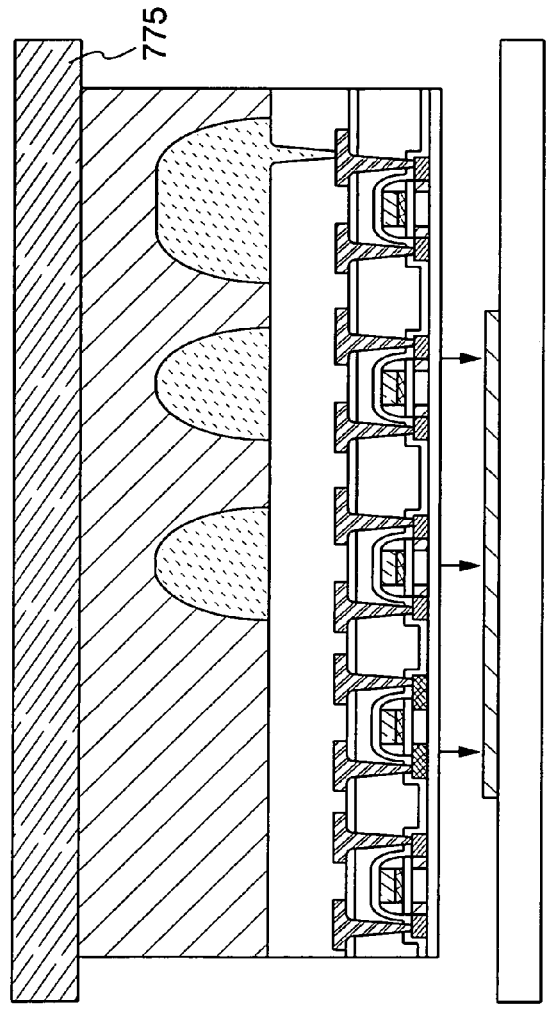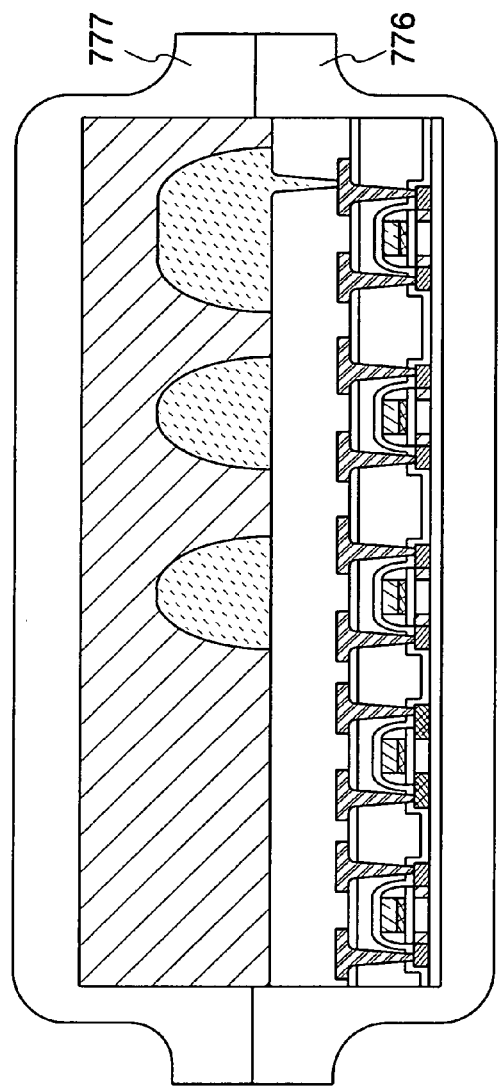
FIG. 6A
FIG. 6B

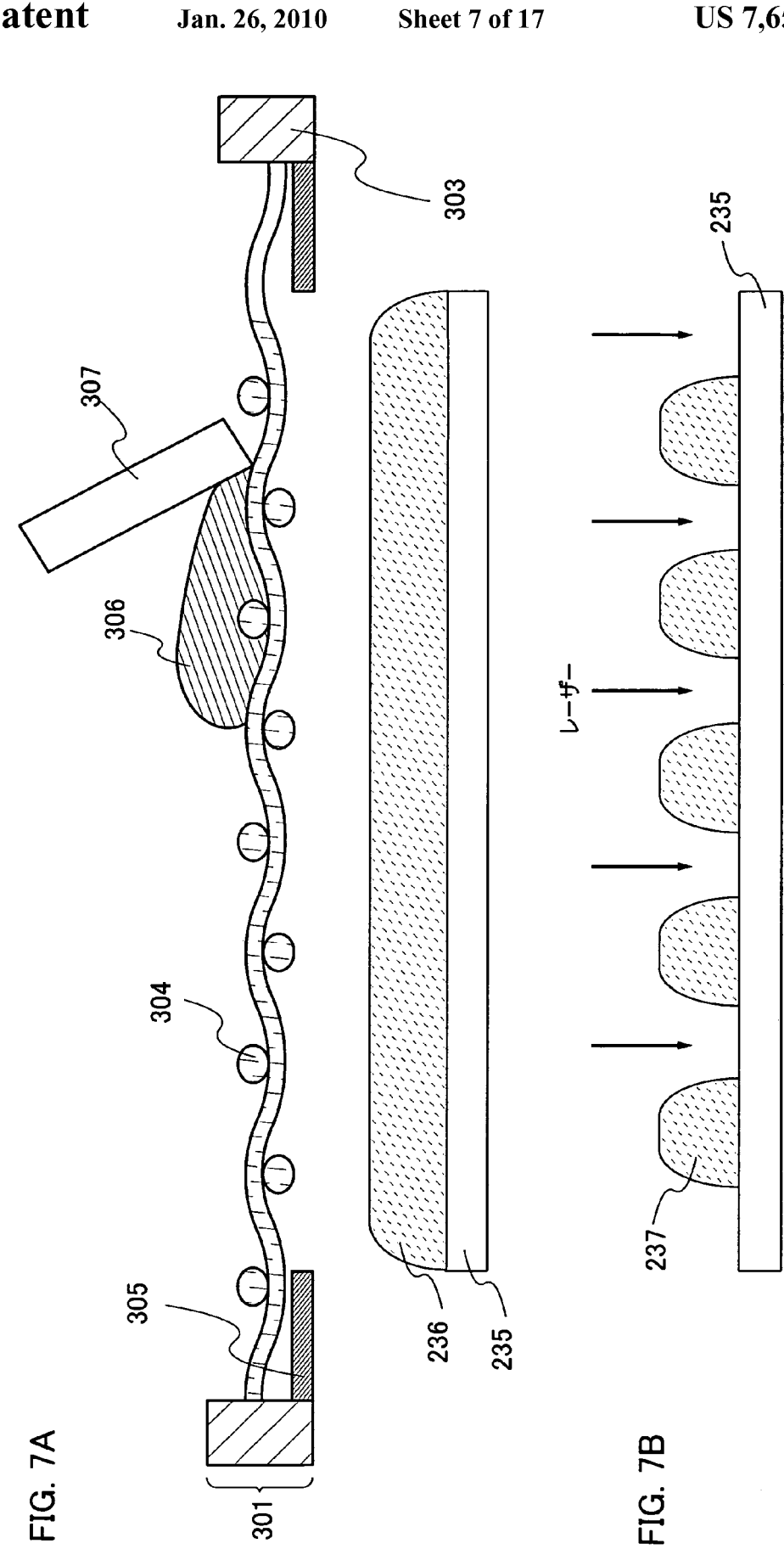

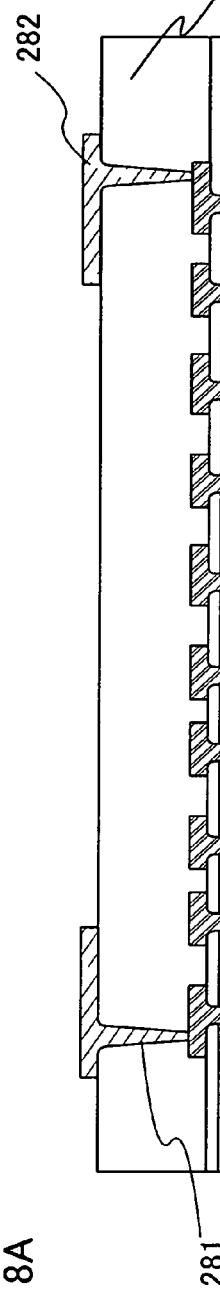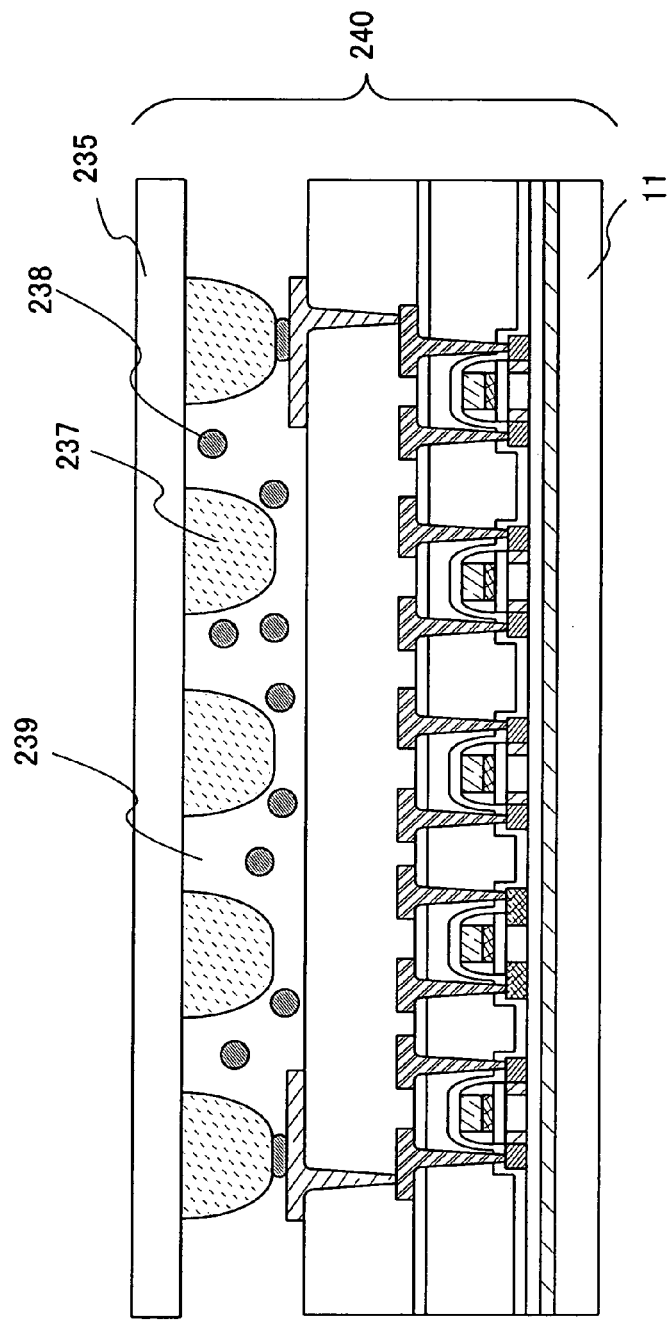
FIG. 8A
FIG. 8B

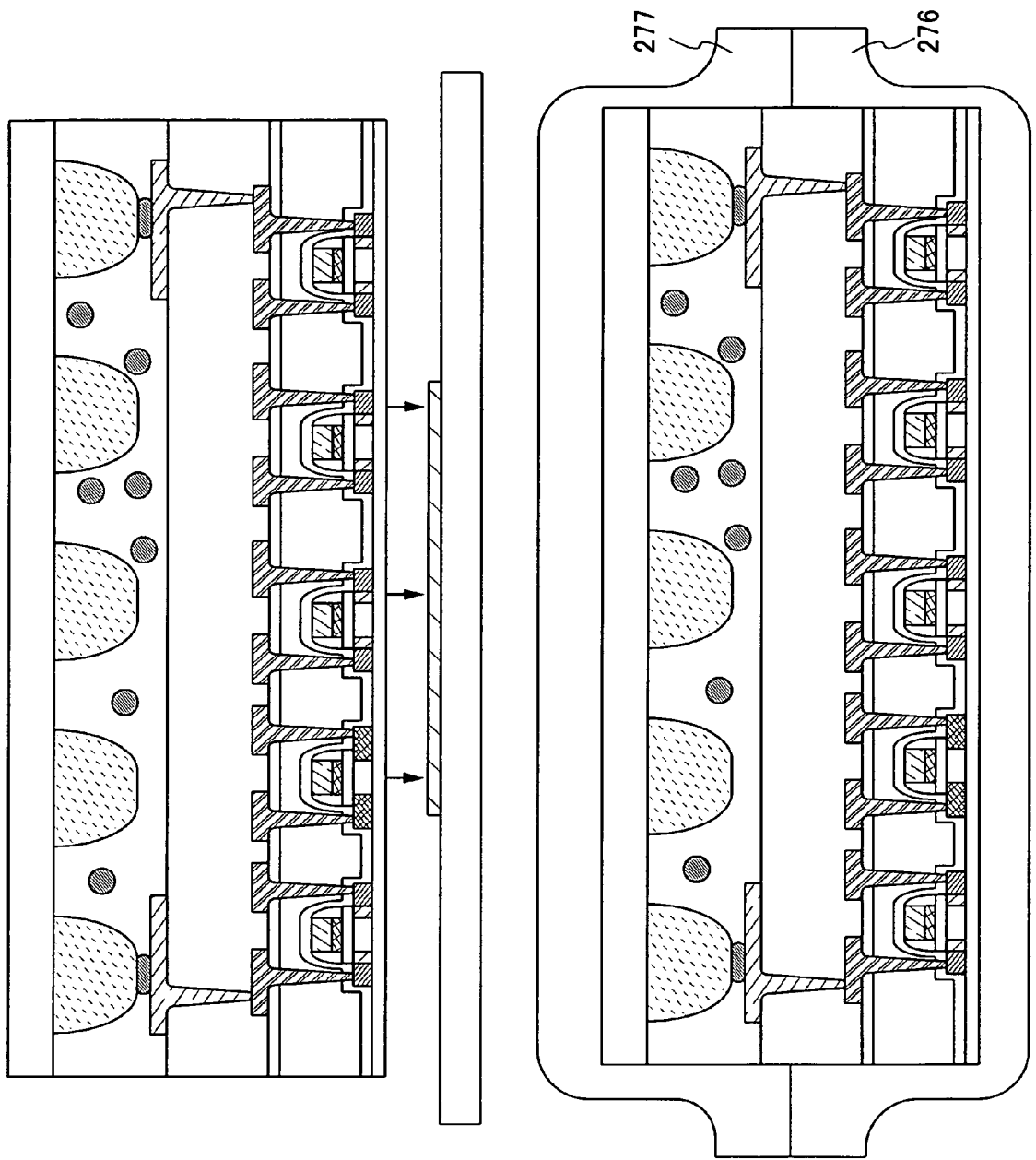

METHOD FOR MANUFACTURING ANTENNA AND METHOD FOR MANUFACTURING SEMICONDUCTOR DEVICE

BACKGROUND OF THE INVENTION

1. Field of the Invention

The present invention relates to a method for manufacturing an antenna. Moreover, the present invention relates to a method for manufacturing a semiconductor device having an antenna.

2. Description of the Related Art

In recent years, development of a semiconductor device which can send and receive data wirelessly has been actively carried out. Such a semiconductor device is also referred to as an IC tag, an ID tag, an RF (radio frequency) tag, an RFID (radio frequency identification) tag, a wireless tag, an electronic tag, a wireless processor, a wireless memory, a wireless chip, or the like.

A wireless chip generally includes an antenna and an IC chip. The IC chip is formed using an element layer having a transistor and the like provided over a silicon wafer.

As one of characteristics required for an antenna of a wireless chip, there is low resistance of an antenna (a wiring) itself. The Q-value has been generally known as a parameter for evaluating an electric characteristic of an antenna, and is represented by a general formula: $Q=\omega L/R$. In the general formula, $\omega L$ represents reactance of a coil and R represents electric resistance of the antenna. According to this general formula, it is apparent that the Q value is inversely proportional to resistance (R) of the antenna, and the Q value is increased as the resistance (R) is reduced. The higher the Q value is, the longer a communication distance of a wireless chip is. Therefore, there is a concern that as increasing the resistance (R) of an antenna, the Q value is reduced, which results in reduction in a communication distance.

As a means for reducing resistance of an antenna, it is desired that a line space (a width between lines) of a wiring used as an antenna is prevented from widening. As a method for forming a wiring used as an antenna, after forming a conductive film, the conductive film is subjected to patterning to form the antenna (for example, see patent document 1). Further, in this specification, "patterning" indicates treatment by which an object is etched into a desired shape.

Patent Document 1: Japanese Patent Application Laid-Open No. 2004-220591

When, after forming a conductive film by sputtering, a method for patterning the conductive film using a mask made from a resist is used, a line space can be set to be about 10 μm. However, this method has problems that since the mask made from a resist is used, the number of steps for forming an antenna is increased so that lots of processing time is required. In addition, manufacturing cost is also increased with increasing the number of steps and processing time.

In a case of a droplet discharging method using an ink-jet technique, processing time required for forming an antenna is shorter than a case of using a method using a mask made from a resist; however, a limit of a line space is about 50 μm so that resistance of the antenna is increased. Note that the droplet discharging method is a method by which a droplet (also, referred to as a dot) of a composition containing a material for a conductive film, an insulating film, or the like is selectively discharged (injected) to form a film in a predetermined position, and this method is also referred to as a dot method.

In a case of using screen printing, as compared with a method using a mask made from a resist, processing time required for forming an antenna is shortened as well as the case of using the droplet discharging method. However, a limit of a line space in the case of using screen printing is about 50 to 100 μm so that the resistance of the antenna is also increased. In particular, in a case of forming an antenna using a printing plate, in which an antenna pattern is formed in advance, the printing plate must be designed in consideration of the amount of a running resin. Therefore, it has been necessary to secure enough space between lines of an antenna.

As mentioned above, when processing time required for forming an antenna is shortened, a line space of the antenna is increased by the conventional method. Accordingly, a width of an antenna cannot be sufficiently widened and resistance of the antenna is increased; and therefore, it has been difficult to improve a communication distance. Further, in a case of forming a loop antenna as an antenna, the sufficient winding number cannot be secured so that it has been difficult to manufacture a semiconductor device with a sufficient communication distance.

SUMMARY OF THE INVENTION

In view of the above described problems, it is an object of the present invention to provide a method for manufacturing an antenna whose resistance is lower than an antenna formed by a conventional manufacturing method by which the antenna is formed without using a mask. Further, it is another object of the present invention to provide a method for manufacturing a semiconductor device having an antenna whose communication distance is improved as compared with a semiconductor device manufactured by a conventional manufacturing method.

One feature of the present invention is that, after a fluid containing conductive particles is applied to a surface of an object (for example, a substrate, a substrate having one surface provided with an insulating film, or an insulating film covering an element such as a thin film transistor, which is formed over a substrate) and is cured, the fluid containing the conductive particles is irradiated with a laser (subjected to scribing) to form an antenna. Further, a substrate having a surface with concavity and convexity or a curved surface generated by a thin film transistor, a gate electrode, a wiring, and the like, which are provided over the substrate, can be used as an object (substrate) over which an antenna is formed, in addition to a substrate having a flat surface.

In an aspect of the present invention regarding a method for manufacturing a semiconductor device, a fluid containing conductive particles is applied over a substrate; and after forming a film containing conductive particles by curing the fluid containing the conductive particles, an antenna is formed by irradiating the film with a laser light.

In another aspect of the present invention regarding a method for manufacturing a semiconductor device, a separation layer is formed over a substrate; an element layer having a thin film transistor is formed over the separation layer; a fluid containing conductive particles is applied to a surface of the element layer; the fluid containing the conductive particles is cured to form a film containing conductive particles; and then the film containing the conductive particles is irradiated with a laser light to form an antenna being electrically connected to the thin film transistor. Thereafter, a protection layer is formed over the element layer and the antenna; the element layer and the protection layer are selectively removed to form an opening portion; the element layer, the antenna, and the protection layer are separated from the substrate; and the element layer, the antenna, and the protection layer are sealed by using a first flexible film and a second flexible film.

In another aspect of the present invention regarding a method for manufacturing a semiconductor device, a fluid containing conductive particles is applied to a surface of a first substrate; the fluid containing the conductive particles is cured to form a film containing the conductive particles; and then the film containing the conductive particles is irradiated with a laser light to form an antenna over the first substrate. Thereafter, the first substrate over which the antenna is formed and a second substrate over which an element layer having a thin film transistor is formed over a separation layer are attached to each other to electrically connect the antenna to the thin film transistor; the first and second substrates which are attached to each other are selectively removed to form an opening portion; the second substrate over which the element layer and the antenna are provided is separated from the first substrate; and the second substrate over which the element layer and the antenna are provided is sealed by using a first flexible film and a second flexible film.

In another aspect of the present invention regarding a method for manufacturing a semiconductor device, a fluid containing conductive particles is applied to a surface of a first substrate; the fluid containing the conductive particles is cured to form a film containing the conductive particles; and then the film containing the conductive particles is irradiated with a laser light to form an antenna over the first substrate. Thereafter, the first substrate over which the antenna is formed and a second substrate over which an element layer having a thin film transistor is formed over a separation layer are attached to each other to electrically connect the antenna to the thin film transistor. Then, only the first substrate which is attached to the second substrate is ground; the ground first substrate is polished; and the polished first substrate and the second substrate are sealed by using a first flexible film and a second flexible film.

In another aspect of the present invention regarding a method for manufacturing a semiconductor device, in the above described structure, screen printing, spin coating, dipping, or a droplet discharging method is used as a method for applying the fluid containing the conductive particles.

Further, in another aspect of the present invention regarding a method for manufacturing a semiconductor device, in the above described structure, particles mainly containing gold, silver, copper, an alloy of gold and silver, an alloy of gold and copper, an alloy of silver and copper, an alloy of gold, silver, and copper, indium tin oxide, conductive oxide in which 2 wt % or more and 20 wt % or less of zinc oxide is mixed in indium oxide, conductive oxide in which 2 wt % or more and 20 wt % or less of silicon oxide is mixed in indium oxide, a lead-free solder, or a solder containing lead, are used as the conductive particles.

In another aspect of the present invention regarding a method for manufacturing a semiconductor device, a separation layer is formed over a substrate; an element layer having a thin film transistor is formed over the separation layer; a conductive film is formed over the element layer; and then the conductive film is irradiated with a laser to form an antenna being electrically connected to the thin film transistor. Thereafter, a protection layer is formed over the element layer and the antenna; the element layer and the protection layer are selectively removed to form an opening portion; the element layer, the antenna, and the protection layer are separated from the substrate; and the element layer, the antenna, and the protection layer are sealed by using a first flexible film and a second flexible film.

In another aspect of the present invention regarding a method for manufacturing a semiconductor device, a conductive film is formed over a first substrate; and then the conductive film is irradiated with a laser to form an antenna over the first substrate. Thereafter, the first substrate over which the antenna is formed and a second substrate over which an element layer having a thin film transistor is formed over a separation layer are attached to each other to electrically connect the antenna to the thin film transistor; the attached first and second substrates are selectively removed to form an opening portion; the second substrate over which the element layer and the antenna are provided is separated from the first substrate; and the second substrate over which the element layer and the antenna are provided are sealed by using a first flexible film and a second flexible film.

In another aspect of the present invention regarding a method for manufacturing a semiconductor device, a conductive film is formed over a first substrate; and then the conductive film is irradiated with a laser to form an antenna over the first substrate. Thereafter, the first substrate over which the antenna is formed and a second substrate over which an element layer having a thin film transistor is formed over a separation layer are attached to each other to electrically connect the antenna to the thin film transistor. Then, only the first substrate which is attached to the second substrate is ground; the ground first substrate is polished; and the polished first substrate and the second substrate are sealed by using a first flexible film and a second flexible film.

In another aspect of the present invention regarding a method for manufacturing a semiconductor device, in the above structure, the conductive film is formed by CVD, sputtering, plating, or evaporation.

In another aspect of the present invention regarding a method for manufacturing a semiconductor device, in the above structure, a solid laser having a wavelength of 1 nm or more and 380 nm or less is used as the laser.

In this specification, the "fluid" indicates a material in a state having fluidity.

In the present invention, since an antenna is formed by being irradiated with a laser, a width between lines of the antenna can be reduced to 20±5 μm, which can be dramatically narrower than that of an antenna formed by a conventional method without using a mask. Therefore, when an antenna is formed in a predetermined area, a width of the antenna can be increased or the winding number can be increased, making it possible to reduce resistance of the antenna and improve a communication distance of a wireless chip. Further, since processing time required for forming an antenna can be drastically shortened as compared with a method by which an object is patterned by using a mask made from a resist, throughput is improved. Moreover, a substrate having a surface with concavity and convexity or a substrate having a curved surface can be used as an object (a substrate) over which an antenna is formed in addition to a substrate having a flat surface, and therefore, there are high expectations for its application in various industrial fields in addition to the semiconductor field. In this specification, "patterning" indicates treatment by which an object is etched into a desired shape.

BRIEF DESCRIPTION OF THE DRAWINGS

FIGS. 4A and 4B are cross sectional views showing Embodiment Mode 1;

FIGS. 6A and 6B are cross sectional views showing Embodiment Mode 1;

FIGS. 7A and 7B are cross sectional views showing Embodiment Mode 2;

FIGS. 8A and 8B are cross sectional views showing Embodiment Mode 2;

FIGS. 10A and 10B are cross sectional views showing Embodiment Mode 2;

DETAILED DESCRIPTION OF THE INVENTION

Embodiment Modes

Figure 1A:
FIGS. 1A to 1C are cross sectional views showing Embodiment Mode 1.

The embodiment modes of the present invention will be described below. It is easily understood by those skilled in the art that the embodiment modes and details herein disclosed can be modified in various ways without departing from the purpose and the scope of the invention. The present invention should not be interpreted as being limited to the description of the embodiment modes to be given below. Further, in the structure of the present invention, reference numerals indicating the same things are commonly used in the drawings.

Embodiment Mode 1

In this embodiment mode, an example of a method for manufacturing a semiconductor device of the present invention will be described with reference to the drawings.

First, a separation layer 12 is formed over a surface of a substrate 11 (FIG. 1A).

The substrate 11 is removed in the subsequent step, and can be formed using a glass substrate, a quartz substrate, a ceramic substrate, or the like. Further, a metal substrate containing stainless steel, a silicon substrate, or a semiconductor substrate having a surface over which an insulating film is formed, may also be used as the substrate 11. Furthermore, a flexible substrate typified by a synthetic resin such as acrylic can be used. Preferably, a glass substrate, a plastic substrate (for example, an acrylic substrate) having a heat resistance property, which can withstand heating treatment in a process of manufacturing a semiconductor device, or the like may be used. As the plastic substrate having the heat resistance property, polyethylene terephthalate (PET), polyethylene naphthalate (PEN), polyether sulfonate (PES), and the like can be given as examples. Such a substrate is not limited to its area or shape; and therefore, when a rectangular substrate with 1 m or more on a side is used as the substrate 11, for example, productivity can be drastically improved. This point is a greater advantage as compared with a case of using a circular silicon substrate. In this embodiment mode, a glass substrate is used as the substrate 11.

Next, formation of the separation layer 12 will be described in detail.

First, a metal film is formed over the substrate 11. The metal film may be formed by a single layer or by stacking a plurality of layers. Note that an insulating film may be provided over the substrate 11 prior to forming the separation layer 12. In particular, when there is a concern that contamination is generated from the substrate, an insulating film is preferably formed between the substrate 11 and the separation layer 12. An insulating film provided between the substrate 11 and the separation layer 12 can be formed to have a single layer structure of an insulating film having at least oxygen or nitrogen such as silicon oxide (SiOx), silicon nitride (SiNx), a silicon oxide film containing nitrogen (an $SiO_xN_y$ film) (x>y, x and y are positive integers), and a silicon nitride film containing oxygen (an $SiN_xO_y$ film) (x>y, x and y are positive integers); or a stacked layer structure thereof. These insulating films can be formed by sputtering or various types of CVD such as plasma CVD. In this embodiment mode, a silicon oxide film containing nitrogen with a thickness of 50 to 150 nm is formed as an insulating film provided between the substrate 11 and the separation layer 12.

The metal film is formed to be a single layer or a stacked layer of a film made from an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir); or an alloy material or a compound material mainly containing the element. These materials can be formed by sputtering or various types of CVD such as plasma CVD. In this embodiment mode, as the metal film, tungsten (W) is formed to have a thickness of 20±5 nm by sputtering.

Next, a metal oxide film is formed over the metal film. As an example of a method for forming the metal oxide film, a method by which a metal oxide film is directly formed by sputtering; and a method by which a metal oxide film is formed by oxidizing a surface of the metal film provided over the substrate 11 through heat treatment or plasma treatment under an oxygen atmosphere; can be given. Preferably, the surface of the metal film is subjected to high-density plasma treatment under an oxygen atmosphere to form a metal oxide film over the surface of the metal film. For example, in a case where a tungsten film with a thickness of 20 to 40 nm is formed by sputtering as the metal film, the tungsten film is subjected to high-density plasma treatment so as to form a metal oxide film made from oxide of tungsten with a thickness of 1 to 20 nm over the surface of the tungsten film.

In this specification, the "high-density plasma treatment" indicates treatment in which an electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. Since the electron temperature in the vicinity of an object (a metal film) formed over a substrate is low while the electron density of plasma is high, damage due to plasma of the substrate can be prevented. Further, since the electron density of plasma is as high as $1 \times 10^{11}$ cm$^{-3}$ or more, a dense film with a uniform thickness, which is formed of oxide generated by oxidation treatment, can be formed. Further, the electron temperature of plasma is as low as 1.5 eV or less, and therefore, oxidation treatment can be performed at a lower temperature as compared with plasma treatment or thermal oxidation. For example, even when plasma treatment is performed at a temperature lower than a strain point of the glass substrate by about 100° C. or more (for example, 250 to 550° C.), plasma oxidation treatment can be sufficiently performed. Note that, as a power supply frequency for generating plasma, a microwave (2.45 GHz) is used. Further, potential of plasma is as low as 5 V or less so that excessive dissociation of molecules of a raw material can be suppressed.

In this embodiment mode, by performing high-density plasma treatment under the oxygen atmosphere to tungsten (W), which is used as the metal film, a metal oxide film is formed over the surface of the metal film. In a plasma condition, an electron density in the vicinity of the substrate is $1 \times 10^{11}$ cm$^{-3}$ or more and $1 \times 10^{13}$ cm$^{-3}$ or less, and an electron temperature of plasma is 0.5 eV or more and 1.5 eV or less. Further, as an atmosphere containing oxygen, a mixed gas of oxygen ($O_2$) or dinitrogen monoxide ($N_2O$) and a rare gas, or a mixed gas of oxygen ($O_2$) or dinitrogen monoxide ($N_2O$), a rare gas, and hydrogen ($H_2$) can be used. As the rare gas, argon (Ar), xenon (Xe), krypton (Kr), and the like can be given. Further, a pressure ratio (or a flow ratio) of respective gases contained in the mixed gas may be appropriately determined. A metal oxide film formed under this condition becomes a film containing a rare gas element. Since the electron temperature is low (1.5 eV or less) and the electron density is high ($1.0 \times 10^{11}$ cm$^{-3}$ or more), an oxide film can be formed at a low temperature with extremely less plasma damage.

As a combination example of a mixed gas, oxygen (or dinitrogen monoxide) may be set to be 0.1 to 100 sccm, and argon may be set to be 100 to 5,000 sccm. Another combination example of a mixed gas, oxygen (or dinitrogen monoxide) may be set to be 0.1 to 100 sccm; hydrogen, 0.1 to 100 sccm; and argon, 100 to 5,000 sccm. The mixed gas is preferably introduced at a flow ratio of oxygen (or dinitrogen monoxide):hydrogen:argon=1:1:100. For example, a mixed gas, in which oxygen (or dinitrogen monoxide) is 5 sccm, hydrogen is 5 sccm, and argon is 500 sccm, may be introduced. Introducing hydrogen in a mixed gas is preferable since processing time of oxidation can be shortened.

When a metal oxide film is formed by performing the high-density plasma treatment to the surface of the metal film under an oxygen atmosphere, a separation layer having the metal oxide film with a superior uniform thickness can be formed even though the metal oxide film is as thin as 20 nm or less. Therefore, the separation layer is not disconnected in the subsequent step so that a semiconductor device with high reliability can be manufactured. Furthermore, since the separation layer having the metal oxide film with uniform thickness can be formed, a problem in which the separation layer is not provided on a part of a substrate and the substrate cannot be separated can be prevented.

Through the above described steps, the separation layer 12 including the metal film and the metal oxide film can be formed. Further, in this embodiment mode, as the separation layer 12, a stacked layer structure including the metal film and the metal oxide film is shown; however, the present invention is not limited thereto. For example, only the metal oxide film may be used as the separation layer 12.

Figure 1B:

Next, a base film 13 is formed over the separation layer 12 (FIG. 1B). As the base film 13, a single layer may be provided or a plurality of films may be stacked. The base film 13 has a function of preventing alkali metal such as sodium (Na) contained in the substrate from penetrating into an element such as a thin film transistor contained in an element layer 14, which will be formed later. Therefore, the base film 13 is not necessarily provided depending on a kind of a substrate.

The base film 13 can be formed by sputtering or various types of CVD such as plasma CVD to have a single layer structure of an insulating film having at least oxygen or nitrogen such as silicon oxide (SiOx), silicon nitride (SiNx), a silicon oxide film containing nitrogen (an $SiO_xN_y$ film) (x>y, x and y are positive integers), and a silicon nitride film containing oxygen (an $SiN_xO_y$ film) (x>y, x and y are positive integers); or a stacked layer structure thereof. For example, in a case where the base film 13 is formed to have a two layer structure, it is preferable that a silicon nitride film containing oxygen be formed as a first insulating film and a silicon oxide film containing nitrogen be formed as a second insulating film. Further, in a case where the base film 13 is formed to have a three layer structure, it is preferable that a silicon oxide film containing nitrogen be formed as a first insulating film, a silicon nitride film containing oxygen be formed as a second insulating film, and a silicon oxide film containing nitrogen be formed as a third insulating film. Alternatively, it is preferable that a silicon oxide film be formed as a first insulating film, a silicon nitride film containing oxygen be formed as a second insulating film, and a silicon oxide film containing nitrogen be formed as a third insulating film. In this embodiment mode, the base film 13 is formed to have a two layer structure including a silicon nitride film containing oxygen and a silicon oxide film containing nitrogen formed over the silicon nitride film containing oxygen.

Next, a layer 14 in which an element such as a thin film transistor is provided (hereinafter, referred to as "an element layer 14") is formed over the base film 13. In this specification, the "element layer" indicates a layer in which at least an element typified by a thin film transistor (TFT) is provided. By using an element such as a thin film transistor, various kinds of integrated circuits such as a CPU (central processing unit), a memory, and a microprocessor can be provided. Note that a structure having an antenna together with a thin film transistor will be described as the element layer 14 in this embodiment mode.

Next, an example of a method for forming the element layer 14, will be described.

Figure 1C:
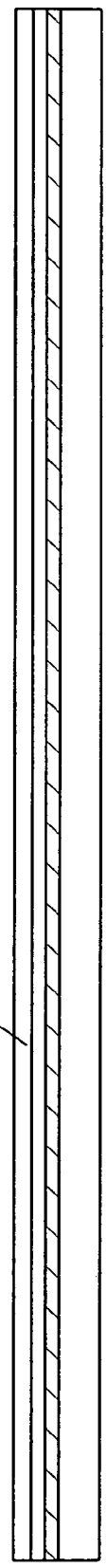
Figure 2A:
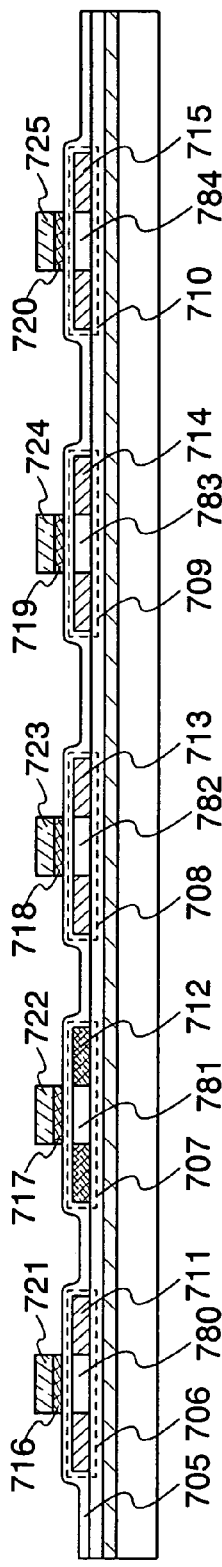
FIGS. 2A to 2C are cross sectional views showing Embodiment Mode 1.

First, an amorphous semiconductor film (for example, a film mainly containing amorphous silicon) 704 is formed over the base film 13 (FIG. 1C). The amorphous semiconductor film 704 is formed to have a thickness of 25 to 200 nm (preferably, 30 to 150 nm) by sputtering or various types of CVD such as plasma CVD. Subsequently, the amorphous semiconductor film 704 is crystallized to form a crystalline semiconductor film. As a crystallization method, laser crystallization, thermal crystallization using RTA or an annealing furnace, thermal crystallization using a metal element for promoting crystallization, thermal crystallization using a metal element for promoting crystallization with laser crystallization, or the like can be used. Thereafter, the thus obtained crystalline semiconductor film is patterned into a desired shape to form crystalline semiconductor films 706 to 710 (FIG. 2A). Note that the separation layer 12, the base film 13, and the amorphous semiconductor film 704 can be successively formed without being exposed to atmospheric air.

An example of steps of manufacturing the crystalline semiconductor films 706 to 710 is briefly described below. As a method for crystallizing the amorphous semiconductor films, laser crystallization, thermal crystallization using RTA or an annealing furnace, thermal crystallization using a metal element for promoting crystallization, thermal crystallization using a metal element for promoting crystallization with laser crystallization, or the like can be given. Further, as another crystallization method, crystallization may be performed by generating thermal plasma by applying DC bias and making the thermal plasma affect a semiconductor film.

In this embodiment mode, an amorphous semiconductor film with a thickness of 40 to 300 nm is formed by plasma CVD, and then the amorphous semiconductor film is crystallized by heat treatment to form the crystalline semiconductor films 706 to 710. As the heat treatment, a laser heating furnace, laser irradiation, or irradiation of light emitted from a lamp instead of laser beam (hereinafter, referred to as lamp annealing), or a combination thereof can be used.

When employing laser irradiation, a continuous wave laser beam (CW laser beam) or a pulsed laser beam (pulse laser beam) can be used. As a usable laser beam, a beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser, can be used. An object is irradiated with a laser beam having a fundamental wave of such lasers or a second to a fourth harmonic of a fundamental wave to obtain a crystal with a large grain size. For instance, the second harmonic (532 nm) or the third harmonic (355 nm) of an Nd:$YVO_4$ laser (fundamental wave of 1,064 nm) can be used. In this case, the power density of about 0.01 to 100 $MW/cm^2$ (preferably, 0.1 to 10 $MW/cm^2$) is required for a laser. The scanning rate is approximately set to be about 10 to 2,000 cm/sec to irradiate the semiconductor film.

Note that each laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; and a Ti: sapphire laser, can continuously oscillate. Further, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a next pulse during a period where the semiconductor film is melted by the laser beam and then is solidified. Therefore, differing from a case of using a pulse laser with a low oscillation frequency, a solid-liquid interface can be continuously moved in the semiconductor film so that crystal grains, which continuously grow toward a scanning direction, can be obtained.

When the amorphous semiconductor film is crystallized by using a continuous wave laser or a laser beam which oscillates at a frequency of 10 MHz or more as described above, a surface of the crystallized semiconductor film can be planarized. As a result, a gate insulating film 705, which will be formed later, can be formed thinly. In addition, this contributes to improve pressure resistance of the gate insulating film.

When ceramic (polycrystal) is used as a medium, the medium can be formed to have a free shape for a short time at low cost. When using a single crystal, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal, and therefore, there is a limitation in improvement in output of a laser by increasing the concentration of the dopant to some extent. However, in the case of the ceramic, the size of a medium can be significantly increased as compared with the case of the single crystal, and therefore, drastic improvement in output of a laser can be expected.

Further, in the case of the ceramic, a medium with a parallelepiped shape or a rectangular parallelepiped shape can be easily formed. In a case of using a medium having such a shape, when oscillated light is made travel in a zig-zag manner inside the medium, a path of the oscillated light can be made long. Therefore, amplitude is increased and a laser beam can be oscillated at high output. Furthermore, a cross section of a laser beam emitted from a medium having such a shape has a quadrangular shape, and therefore, as compared with a laser beam with a circular shape, the laser beam with the quadrangular shape in cross section have an advantage to be shaped into a linear beam. By shaping a laser beam emitted in the above described manner using an optical system, a linear beam with 1 mm or less in length of a short side and several mm to several m in length of a long side can be easily obtained. In addition, when a medium is uniformly irradiated with excited light, a linear beam is emitted with a uniform energy distribution in a long side direction.

When a semiconductor film is irradiated with this linear beam, the semiconductor film can be uniformly annealed. In a case where uniform annealing is required from one end to the other end of the linear beam, an arrangement in which slits are provided in both ends of the linear beam so as to shield an attenuated portion of energy of the linear beam, or the like may be performed.

When a semiconductor film is annealed by using the thus obtained linear beam with uniform intensity and a semiconductor device is manufactured by using this semiconductor film, a characteristic of the semiconductor device can be made favorable and uniform.

As thermal crystallization using a metal element for promoting crystallization, an example of a specific method will be given. After keeping a solution containing nickel, which is a metal element for promoting crystallization, over an amorphous semiconductor film, the amorphous semiconductor film is subjected to dehydrogenation treatment (500° C. for one hour) and thermal crystallization treatment (550° C. for four hours) so as to form a crystalline semiconductor film. Thereafter, the crystalline semiconductor film is irradiated with a laser beam if required, and then, the crystalline semiconductor film is patterned by photolithography to form the crystalline semiconductor films 706 to 710.

The thermal crystallization using a metal element for promoting crystallization has advantages of being capable of crystallizing an amorphous semiconductor film at a low temperature for a short time and aligning a direction of crystals; however, the thermal crystallization has drawbacks that off current is increased due to a remaining metal element in the crystalline semiconductor film and characteristics of the crystalline semiconductor film are not stabilized. Therefore, it is preferable to form an amorphous semiconductor film serving as a gettering site over the crystalline semiconductor film. Since the amorphous semiconductor film, which becomes the gettering site, is necessary to contain an impurity element such as phosphorus or argon, the amorphous semiconductor film is preferably formed by sputtering by which the amorphous semiconductor film can contain argon at a high concentration. Thereafter, heat treatment (RTA, thermal annealing using an annealing furnace, or the like) is performed to disperse the metal element in the amorphous semiconductor film. Subsequently, the amorphous semiconductor film containing the metal element is removed. By carrying out such gettering process, the amount of the metal element contained in the crystalline semiconductor film can be reduced or the metal element can be removed.

Next, a gate insulating film 705 is formed to cover the crystalline semiconductor films 706 to 710. The gate insulating film 705 is formed by using a single layer or a stacked layer containing silicon oxide or silicon nitride by sputtering or various types of CVD such as plasma CVD. Specifically, the gate insulating film 705 is formed by using a single layer of a film containing silicon oxide, a film containing silicon oxynitride, or a film containing silicon nitride oxide, or by appropriately stacking these films. Alternatively, the crystalline semiconductor films 706 to 710 may be subjected to the above described high-density plasma treatment under an atmosphere containing oxygen, nitrogen, or both of oxygen and nitrogen to oxidize or nitride each surface of the crystalline semiconductor films 706 to 710 so as to form the gate insulating film. The gate insulating film formed by the high-density plasma treatment has superior uniformity in film thickness and film quality as compared with a film formed by CVD or sputtering. In addition, a dense film can be formed as the gate insulating film by the high-density plasma treatment. As an atmosphere containing oxygen, a mixed gas of oxygen ($O_2$), nitrogen dioxide ($NO_2$) or dinitrogen monoxide ($N_2O$), and a rare gas; or a mixed gas of oxygen ($O_2$), nitrogen dioxide ($NO_2$) or dinitrogen monoxide ($N_2O$), a rare gas, and hydrogen ($H_2$); can be used. Further, as an atmosphere containing nitrogen, a mixed gas of nitrogen ($N_2$) or ammonia ($NH_3$) and a rare gas; or a mixed gas of nitrogen ($N_2$) or ammonia ($NH_3$), a rare gas, and hydrogen ($H_2$); can be used. Each surface of the crystalline semiconductor films 706 to 710 can be oxidized or nitrided by oxygen radical (which contains OH radical in some cases) or nitrogen radical (which contains NH radical in some cases) generated by high-density plasma.

When the gate insulating film 705 is formed by the high-density plasma treatment, an insulating film with a thickness of 1 to 20 nm, and typically, 5 to 10 nm, is formed over the crystalline semiconductor films 706 to 710. A reaction in this case is a solid-phase reaction, and therefore, interface state density between the insulating film and the crystalline semiconductor films 706 to 710 can be extremely reduced. Further, since the crystalline semiconductor films 706 to 710 can be directly oxidized or nitrided, variations in thickness of the gate insulating film 705 to be suppressed significantly and ideally. Furthermore, since strong oxidation is not generated in a crystal grain boundary of crystalline silicon, an extremely preferable state is made. That is, when each surface of the crystalline semiconductor films is subjected to solid-phase oxidation by the high-density plasma treatment shown here, an insulating film with low interface state density and good uniformity can be formed without generating abnormal oxidation reaction in a crystal grain boundary.

Note that, as the gate insulating film 705, only an insulating film formed through the high-density plasma treatment may be used. Alternatively, the insulating film formed through the high-density plasma treatment and another insulating film including silicon oxide, silicon nitride containing oxygen, or silicon oxide containing nitrogen by CVD utilizing plasma or a thermal reaction may be stacked to form the gate insulating film 705. In either case, when a transistor is formed to have a gate insulating film which partly or entirely includes an insulating film formed by high-density plasma, variations in characteristics can be reduced.

Further, the crystalline semiconductor films 706 to 710 formed by crystallizing the amorphous semiconductor film 704 by irradiation of a continuous wave laser beam or a laser beam oscillated at a frequency of 10 MHz or more while scanning the amorphous semiconductor film with the laser beam in one direction, have a characteristic that crystals grow in a scanning direction of the laser beam. Therefore, when a transistor is disposed such that the scanning direction corresponds to a channel length direction (a direction of flowing carries when a channel formation region is formed) and the gate insulating film 705 formed by the high-density plasma treatment is combined with the transistor, a transistor with less variations in characteristics and high electron field-effect mobility can be obtained.

Next, a first conductive film and a second conductive film are stacked over the gate insulating film 705. The first conductive film and the second conductive film may be formed by supttering or various types of CVD such as plasma CVD. In this embodiment mode, the first conductive film is formed to have a thickness of 20 to 100 nm, whereas the second conductive film is formed to have a thickness of 100 to 400 nm. Further, the first conductive film and the second conductive film can be formed by using an element selected from tantalum (Ta), tungsten (W), titanium (Ti), molybdenum (Mo), aluminum (Al), copper (Cu), chromium (Cr), niobium (Nb), and the like; or an alloy material or a compound material mainly containing these elements. Further, the first and second conductive films can be formed by using a semiconductor material typified by polycrystalline silicon doped with an impurity element such as phosphorus. As a combination of the first conductive film and the second conductive film, a tantalum nitride (TaN) film and a tungsten (W) film; a tungsten nitride (WN) film and a tungsten film; a molybdenum nitride (MoN) film and a molybdenum (Mo) film; and the like can be given. Since tungsten and tantalum nitride have high heat resistance properties, after forming the first and second conductive films using tungsten or tantalum nitride, heat treatment for thermal activation can be carried out. Further, a single layer structure or a three layer structure may be employed instead of the two layer structure of the first and second conductive films. In a case of a three layer structure, it is preferable to employ a structure in which a molybdenum film, an aluminum film, and another molybdenum film are sequentially stacked from a substrate side; or a structure in which a titanium film, an aluminum film, and another titanium film are sequentially stacked from the substrate side.

Next, a mask is formed using a resist by photolithography. While utilizing the mask, etching treatment is performed to form gate electrodes and gate wirings so as to form conductive films 716 to 725 serving as gate electrodes (hereinafter, sometimes referred to as "gate electrodes" in this specification).

Next, after forming a mask using a resist by photolithography, an impurity element imparting N-type conductivity is added at a low concentration to the crystalline semiconductor films 706 and 708 to 710 by ion doping or ion implantation. In this manner, N-type impurity regions 711 and 713 to 715 and channel formation regions 780 and 782 to 784 are formed. As the impurity element imparting the N-type conductivity, an element belonging to Group 15 of the periodic table may be used, and for example, phosphorus (P) or arsenic (As) is used.

Next, a mask is formed using a resist by photolithography. While utilizing the mask, an impurity element imparting P-type conductivity is added to the crystalline semiconductor film 707 to form a P-channel impurity region 712 and a channel formation region 781. As the impurity element imparting the P-type conductivity, for example, boron (B) is used. Note that after forming the N-type impurity regions 711 and 713 to 715, the P-type impurity region 712 may be formed in the same manner as this embodiment mode. Alternatively, after forming the P-type impurity region 712, the N-type impurity regions 711 and 713 to 715 may be formed.

Figure 2B:
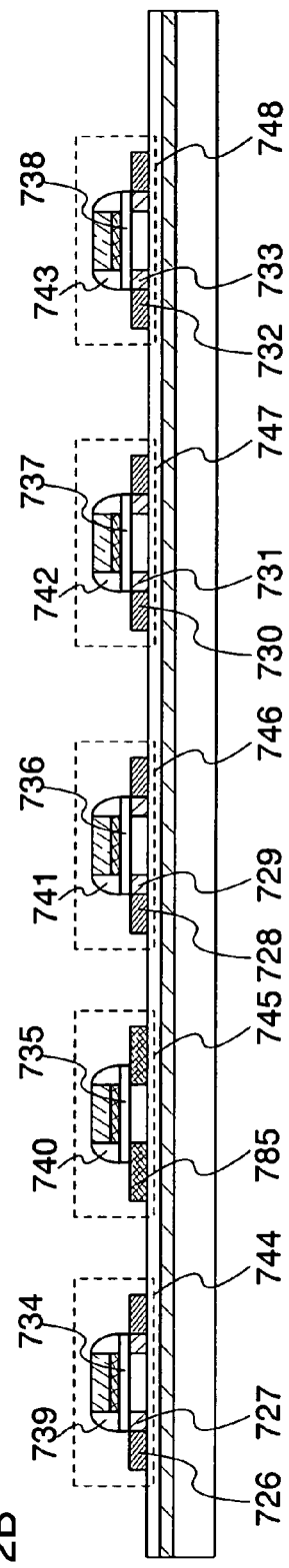

Subsequently, an insulating film is formed to cover the gate insulating film 705 and the conductive films 716 to 725. The insulating film is formed using a single layer or a stacked layer of a film made from an inorganic material such as silicon, silicon oxide, or silicon nitride or a film made from an organic material such as an organic resin by sputtering or various types of CVD such as plasma CVD. Then, the insulating film is selectively etched by anisotropic etching mainly in a perpendicular direction to form insulating films (also, referred to as sidewalls) 739 to 743 being in contact with side surfaces of the conductive films 716 to 725 (FIG. 2B). At the same time of forming the insulating films 739 to 743, insulating films 734 to 738 are formed by etching the gate insulating film 705. The insulating films 739 to 743 will be used as masks for doping when forming an LDD (lightly doped drain) region.

Next, by using a mask formed using a resist by photolithography and the insulating films 739 to 743 as masks, an impurity element imparting N-type conductivity is added to the crystalline semiconductor films 706 and 708 to 710 to form first N-type impurity regions (LDD regions) 727, 729, 731, and 733 and second N-type impurity regions 726, 728, 730, and 732. A concentration of the impurity element contained in the first N-type impurity regions 727, 729, 731, and 733 is lower than that of the impurity element contained in the second N-type impurity regions 726, 728, 730, and 732. Through the above described steps, N-type thin film transistors 744 and 746 to 748, and a P-type thin film transistor 745 are completed.

In order to form an LDD region, there is a technique in which a gate electrode having a stacked structure including two or more layers is formed, etching by which the gate electrode is tapered or anithotropic etching is performed, and a conductive film of a lower layer of the gate electrode is used as a mask; and a technique in which an insulating film of a sidewall is used as a mask. A thin film transistor formed by using the former technique has a structure in which an LDD region is overlapped with the gate electrode with the gate insulating film interposed therebetween. However, since the etching by which the gate electrode is tapered or the anisotropic etching is used in this structure, it is difficult to control a width of the LDD region, and therefore, an LDD region sometimes cannot be formed without a proper etching step. On the other hand, the latter technique using the insulating film of the sidewall as a mask can control a width of an LDD region more easily as compared with the former technique, so that the LDD region can be certainly formed. Note that "the etching by which the gate electrode is tapered" indicates etching by which a side surface of the gate electrode is made to have a tapered shape.

After removing an oxide film, which is naturally formed over exposed surfaces of the N-type impurity regions 726, 728, 730, and 732 and the P-type impurity region 785, silicide regions may be arbitrarily formed by using a metal film. As the metal film, a film made from nickel, titanium, cobalt, or platinum; a film made from an alloy containing at least two kinds of these elements; or the like can be used. Specifically, a nickel film is used as the metal film, for example. The nickel film is formed by sputtering at power of 500 W to 1 kW under a room temperature, and then a silicide region is formed by heat treatment. The heat treatment can employ RTA, an annealing furnace, or the like. In this case, by controlling a thickness of the metal film, a heating temperature, and a heating time, silicide regions may be formed only over the surfaces of the N-type impurity regions 726, 728, 730, and 732 and the P-type impurity region 785. Alternatively, a silicide region can be formed over an entire surface of the substrate. Then, nickel, which is unreacted, is removed. For example, the unreacted nickel is removed by using an etching solution of HC1:HNO$_3$:H$_2$O=3:2:1.

Note that this embodiment mode shows an example in which the thin film transistors 744 to 748 are of a top-gate type; however, it is obvious that each of the thin film transistors may be a bottom-gate thin film transistor. Further, a single gate structure in which a single channel formation region is formed in each of the thin film transistors 744 to 748, is described in this embodiment mode. Alternatively, a double gate structure in which two channel formation regions are formed in each of the thin film transistors or a triple gate structure in which three channel formation regions are formed in each of the thin film transistors may be employed. Moreover, a dual gate structure having two gate electrodes which are disposed over and under a channel formation region through a gate insulating film, or other structure may be employed.

Each of the thin film transistors 744 to 748 may have a structure other than the structure described in this embodiment mode. For example, each of the thin film transistors may have an impurity region (including a source region, a drain region, and an LDD region). Alternatively, each of the thin film transistors may be a P-channel TFT, an N-channel TFT, or a CMOS circuit. Further, an insulating film (a sidewall) may be formed to be in contact with a side surface of a gate electrode provided over or under the semiconductor film.

After completing the N-type thin film transistors 744 and 746 to 748 and the P-type thin film transistor 745 through the above described steps, heat treatment for recovering crystallinity of the semiconductor films or activating the impurity elements added to the semiconductor films, may be performed. Further, after performing the heat treatment, the exposed gate insulating film 705 is preferably subjected to high-density plasma treatment under an atmosphere containing hydrogen so that a surface of the gate insulating film 705 may contain hydrogen. This is because the hydrogen can be utilized when performing a step of hydrogenating the semiconductor film later. Further, by performing high-density plasma treatment under an atmosphere containing hydrogen while heating the substrate at 350 to 450° C., hydrogenation of the semiconductor film can be performed. Further, as the atmosphere containing hydrogen, a mixed gas of hydrogen (H$_2$) or ammonia (NH$_3$) and a rare gas (for example, argon (Ar)) can be used. When a mixed gas of ammonia (NH$_3$) and a rare gas (for example, argon (Ar)) is used as the atmosphere containing hydrogen, the surface of the gate insulating film 705 can be hydrogenated and nitrided at the same time.

Figure 2C:
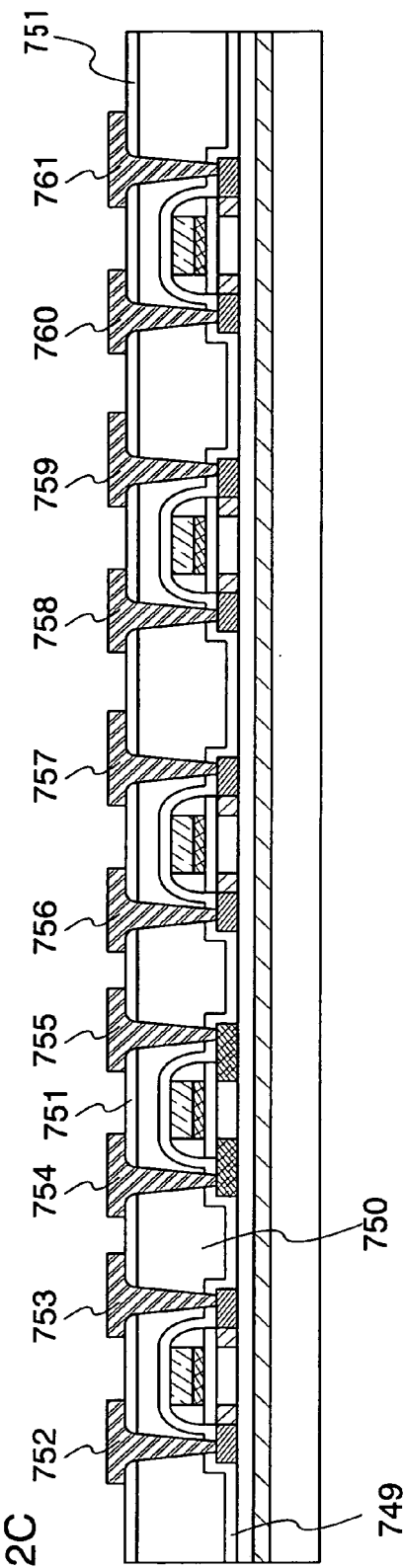

Then, a single layer or a stacked layer of an insulating film is formed to cover the thin film transistors 744 to 748 (FIG. 2C). The insulating film covering the thin film transistors 744 to 748 is formed using a single layer or a stacked layer made from an inorganic material such as silicon oxide or silicon nitride, an organic material such as polyimide, polyamide, benzocyclobutene, acrylic, epoxy, or siloxane, or the like, by an SOG technique, a droplet discharging method, or the like. In this specification, siloxane has a skeleton structure including silicon (Si)-oxygen (O) bonds and an organic group containing at least hydrogen (for example, an alkyl group, or aromatic hydrocarbon) is used as a substituent. Further, as the substituent, a fluoro group may be used, or both of an organic group containing at least hydrogen and a fluoro group may be used. For example, in a case where the insulating film covering the thin film transistors 744 to 748 has a three layer structure, a film mainly containing silicon oxide may be formed as a first insulating film 749, a film mainly containing a resin may be formed as a second insulating film 750, and a film mainly containing silicon nitride may be formed as a third insulating film 751. Further, in a case where the insulating film covering the thin film transistors 744 to 748 has a single layer structure, a silicon nitride film or a silicon nitride film containing oxygen may be formed. In this case, it is preferable that by performing high-density plasma treatment under an atmosphere containing hydrogen with respect to the silicon nitride film or the silicon nitride film containing oxygen, hydrogen be contained in a surface of the silicon nitride film or the silicon nitride film containing oxygen. This is because the hydrogen can be utilized when performing a step of hydrogenating the semiconductor films later. Further, by performing high-density plasma treatment under an atmosphere containing hydrogen while heating the substrate at 350 to 450° C., hydrogenation of the semiconductor film can be performed. Note that, as the atmosphere containing hydrogen, a mixed gas of hydrogen ($H_2$) or ammonia ($NH_3$) and a rare gas (for example, argon (Ar)) can be used. When a mixed gas of ammonia ($NH_3$) and a rare gas (for example, argon (Ar)) is used as the atmosphere containing hydrogen, the surface of the gate insulating film 705 can be simultaneously hydrogenated and nitrided.

Note that, prior to forming the insulating films 749 to 751, or after forming one or a plurality of thin films of the insulating films 749 to 751, heat treatment for recovering crystallinity of the semiconductor films, activating the impurity elements added to the semiconductor films, or hydrogenating the semiconductor films, may be performed. The heat treatment may use thermal annealing, laser annealing, RTA, or the like. For example, in order to activate the impurity elements, thermal annealing at 500° C. or more may be performed. Further, in order to hydrogenate the semiconductor films, thermal annealing at 350 to 450° C. may be performed.

Next, the insulating films 749 to 751 are etched by photolithography to form contact holes through which the N-type impurity regions 726, 728, 730, and 732 and the P-type impurity region 785 are exposed. Subsequently, a conductive film is formed to fill the contact holes. The conductive film is patterned to form conductive films 752 to 761 each serving as a source wiring or a drain wiring.

The conductive films 752 to 761 are formed by using a conductive film mainly containing aluminum (Al) by sputtering, various types of CVD such as plasma CVD, or the like. The conductive film mainly containing aluminum (Al) corresponds to a material mainly containing aluminum, which also contains nickel, or an alloy material mainly containing aluminum, which also contains nickel and one or both of carbon and silicon, for example. Since the conductive film mainly containing aluminum generally has a drawback of a poor heat resistance property, the conductive film mainly containing aluminum is preferably sandwiched between barrier films. The barrier films indicate films having a function of suppressing hillock of the conductive film mainly containing aluminum or improving a heat resistance property. As a material having such a function, chromium, tantalum, tungsten, molybdenum, titanium, silicon, and nickel, or nitride of these elements can be given. As an example of a structure of each of the conductive films 752 to 761, a structure in which a titanium film, an aluminum film, and another titanium film are sequentially stacked from a substrate side, can be given. Since titanium is an element having a high reducing property, even when a thin oxide film is naturally formed on the crystalline semiconductor films, the oxide film naturally formed can be reduced by the titanium so as to make good contact to the crystalline semiconductor films. Further, the titanium film formed between the crystalline semiconductor films and the aluminum film, is preferably subjected to high-density plasma treatment under an atmosphere containing nitrogen to nitride a surface of the titanium film. In a condition of the high-density plasma treatment, electron density of plasma is $1\times10^{11}$ cm$^{-3}$ or more and $1\times10^{13}$ cm$^{-3}$ or less, and an electron temperature of plasma is 0.5 eV or more and 1.5 eV or less. As the atmosphere containing nitrogen, a mixed gas of $N_2$ or $NH_3$ and a rare gas, or a mixed gas of $N_2$ or $NH_3$, a rare gas, and $H_2$ can be used. Nitriding the surface of the titanium film makes it possible to prevent alloying of titanium and aluminum and prevent aluminum from dispersing in the crystalline semiconductor films through the titanium film in a subsequent heat treatment or the like. Note that an example of sandwiching the aluminum film with the titanium films is described here, and this is the same for a case of using chromium films, tungsten films, or the like instead of the titanium films. More preferably, formation of one titanium film, nitriding treatment of the surface of the titanium film, formation of the aluminum film, and formation of another titanium film are successively carried out by using a multi-chamber apparatus without exposing these films to atmospheric air.

Figure 3:
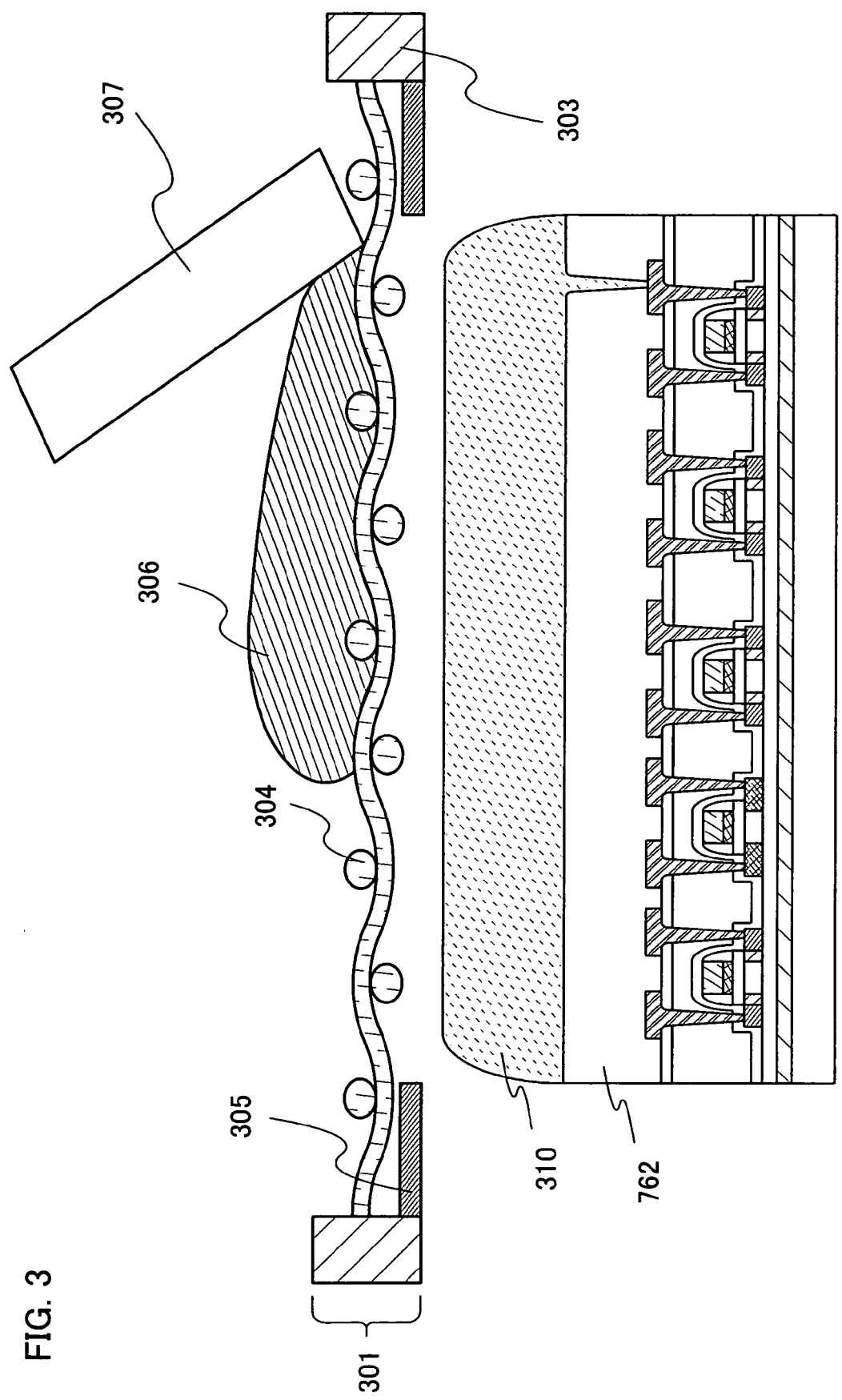
FIG. 3 is a cross sectional view showing Embodiment Mode 1.

Next, an insulating film 762 is formed to cover the conductive films 752 to 761 (FIG. 3). The insulating film 762 is formed to be a single layer or a stacked layer using an inorganic material or an organic material by SOG, a droplet discharging method, or the like. In this embodiment mode, the insulating film 762 is formed to have a thickness of 0.75 to 3 μm.

Next, the insulating film 762 is etched by photolithography to form a contact hole through which the conductive film 761 is exposed. Subsequently, a conductive film is formed over a top surface of the insulating film 762 so as to fill the contact hole. As a method for forming the conductive film, for example, the conductive film can be formed using a fluid containing conductive particles by any one of screen printing, spin coating, dipping, a droplet discharging method using an ink-jet technique, or the like. Further, the conductive film may be formed by CVD, sputtering, plating, or evaporation. In this case, the conductive film can be formed using any one of Au, Ag, Cu, Ni, Pt, Pd, Ir, Rh, W, Al, Ta, Mo, Cd, Zn, Fe, Ti, Zr, and Ba, or an alloy or a compound thereof. Further, the conductive film can also be formed using polycrystalline Si or polycrystalline Ge doped with an impurity element such as phosphorus.

In this embodiment mode, a method for forming the conductive film by using screen printing will be described in detail. When the conductive film is formed by screen printing, a thickness of the conductive film can be easily made thicker as compared with a case of using another method, and therefore, the screen printing is preferable. For example, as compared with a case where there is a limitation that the conductive film is formed to have a thickness of up to 5 μm by sputtering or about up to several μm by the droplet discharging method, when using screen printing, the conductive film with a thickness of up to about 50 μm (for example, 20 μm or more and 50 μm or less) can be formed at maximum. By forming the thicker conductive film, resistance of a wiring, which will be an antenna later, can be further reduced.

Conductive particles with a diameter of 1 nm or more and 100 nm or less can be used. In this specification, a "fluid" indicates a material having fluidity, and for example, indicates a paste-like material. As shown in FIG. 3, in the screen printing, a screen printing plate 301 having a metallic mesh 304 and emulsion 305 for a mask inside of a frame 303, is provided over an object. Next, a fluid 306 containing conductive particles is provided over the screen printing plate 301. The fluid 306 containing the conductive particles is pressed and pushed out by using a squeegee 307, a roller, or the like so that the fluid is applied to a surface of an object (the insulating film 762). As a result, the fluid is applied to the top surface of the insulating film 762 to fill the contact hole. Note that, prior to pushing out the fluid containing the conductive particles by the squeegee, the roller or the like, the fluid containing the conductive particles may be spread over the screen printing plate by a scraper.

Next, the fluid 306 containing the conductive particles, which is applied to the top surface of the insulating film 762 and inside of the contact hole is baked and cured to form a conductive film 310. In order to completely cure the fluid, a baking temperature of 150° C. or more is required. In a case of using fine particles mainly containing silver as conductive fine particles contained in the fluid, when a baking temperature is more than 300° C., a dense property is degraded, so that the fluid easily becomes a porous state with a rough surface. Therefore, the fluid is preferably baked in a temperature range of 150 to 300° C. In this embodiment mode, baking time is set to be one hour; however, baking time may be arbitrarily set such that the fluid is completely cured. Although the fluid 306 is cured by baking in this embodiment mode, when using a light curing resin as the fluid 306, the fluid 306 can be cured by being irradiated with light (for example, ultraviolet ray, electron beam, or visible ray). That is, a method for curing the fluid is not limited to baking, and a method in which the fluid is irradiated with light can also be used. As an example of the light curing resin, an acrylic resin, a silicone resin, and the like can be given.

The conductive fine particles are uniformly dispersed in the fluid without aggregating in a solvent. As examples of the conductive fine particles contained in the fluid, the above mentioned fine particles mainly contaiing silver can be given. Further, any material can be used as a wiring serving as an antenna after baking. For example, fine particles mainly containing any one of gold, silver, copper, an alloy of gold and silver, an alloy of gold and copper, an alloy of silver and copper, and an alloy of gold, silver, and copper, may be used. Further, fine particles mainly containing indium tin oxide (hereinafter, referred to as ITO), conductive oxide in which 2 wt % or more and 20 wt % or less zinc oxide is mixed in indium oxide (hereinafter, referred to as IZO (indium zinc oxide)), or conductive oxide in which 2 wt % or more and 20 wt % or less silicon oxide is mixed in indium oxide (hereinafter, referred to as ITSO), may be used. Further, fine particles mainly containing a lead-free solder may be used. In this case, fine particles with a diameter of 20 μm or less are preferably used. As compared with the above mentioned fine particles mainly containing silver, the fine particles mainly containing a lead-free solder is superior in low cost. It is also possible to use fine particles mainly containing a solder containing lead, though environmental pollution may arise.

Next, the conductive film 310 is patterned by being irradiated with a laser to form wirings 763 to 765 (FIG. 4A). Each of the wirings 763 to 765 serves as an antenna. The patterning using laser irradiation may be a physical technique (also, referred to as "laser ablation") or a chemical technique. The physical technique is a process where bonding of atoms or molecules inside a solid (which is the conductive film in this embodiment mode) is photodissociated by photon energy of a laser beam under atmospheric air or an inert gas atmosphere while the conductive film, which is decomposed with heat generated by absorption of excessive laser energy, is scattered. The chemical technique is a process where an object is irradiated with a laser beam while keeping it under a reactive gas (etchant). Further, a condition or a type of a laser is not particularly limited. For example, a continuous wave laser beam (CW laser beam) or a pulsed wave laser beam (pulsed laser beam) can be used. As a usable laser beam, a beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser, can be used. Preferably, a solid laser with a wavelength of 1 nm or more and 380 nm or less may be used. In this embodiment mode, an UV laser is used.

Note that when the conductive film 310 is irradiated with a laser beam to perform the patterning (scribing), there is a possibility that the insulating film 762 underlying the conductive film 310 is partly etched and an element formed under the insulating film 762 is also damaged. Whether or not the insulating film 762 is etched is determined by a material of the insulating film 762 and a condition of laser irradiation. Therefore, in order to prevent the insulating film 762 from being etched, the insulating film 762 may be formed using a dense hard film like DLC (diamond like carbon), or a condition of laser irradiation may be appropriately determined. Further, the insulating film 762 is preferably formed by using a stacked structure of a planarization film made from an organic material and a DLC film formed over the planarization film. When the insulating film 762 includes such a stacked structure, unevenness generated by the conductive films 752 to 761 can be reduced by the planarization film and an element formed under the insulating film 762 can be protected by the DLC film in laser irradiation. Even when the insulating film 762 is partly etched, an insulating film may be formed over the insulating film 762. In this embodiment mode, since an insulating film 15 is provided over the insulating film 762 after patterning, if the surface of the insulating film 762 is partly etched, no problems arise.

A width between lines of the conductive film (the antenna) manufactured by this method is as narrow as 20±5 μm, and therefore, a region per unit area in which the antenna can be formed, can be increased. As a consequence, resistance of the antenna can be reduced, thereby improving a communication distance of a wireless chip. Moreover, processing time required for forming the antenna can be extremely shortened as compared with a case of employing a patterning method using a mask made from a resist.

Further, when after forming the conductive film by using the screen printing, the antenna is formed by patterning the conductive film with laser irradiation, advantageous effects described below can be obtained as compared with a case of directly forming an antenna by screen printing. Specifically, when an antenna is directly formed by screen printing, since a running resin is generated in steps of forming the antenna from a printing step to baking (a baking step), a cross section of the formed antenna has a trapezoidal shape, and therefore, resistance of the antenna is increased. On the other hand, when after forming the conductive film by using the screen printing, the antenna is formed by patterning the conductive film with laser irradiation, a cross section of the formed antenna does not easily have a trapezoidal shape, and hence, resistance of the antenna can be reduced.

The element layer 14 is completed through the above described steps.

Next, an insulating film 15 (a protection layer) is formed by SOG, a droplet discharging method, or the like so as to cover the wirings 763 to 765 serving as the antenna (FIG. 4B). The insulating film 15 serves as the protection layer for securing the strength of the element layer 14, and therefore, the insulating layer 15 is sometimes denoted as the protection layer below in this specification. The insulating film 15 is preferably formed to cover a side surface of the base film 13 and a side surface of the element layer 14. Although the insulating film 15 is provided over the entire surface to cover the base film 13 and the element layer 14 in this embodiment mode, the insulating film 15 is not necessarily provided over an entire surface and may be provided selectively. Note that when the element layer 14 has enough strength, the insulating film 15 is not required to be provided.

The insulating film 15 may be formed by using a film containing carbon such as DLC (diamond like carbon), a silicon oxide film containing nitrogen, a silicon nitride film containing oxygen, a film made from a resin material such as epoxy or other organic material, or the like. The insulating film 15 can be formed by sputtering, various types of CVD such as plasma CVD, spin coating, a droplet discharging method, screen printing, or the like.

Figure 5A:
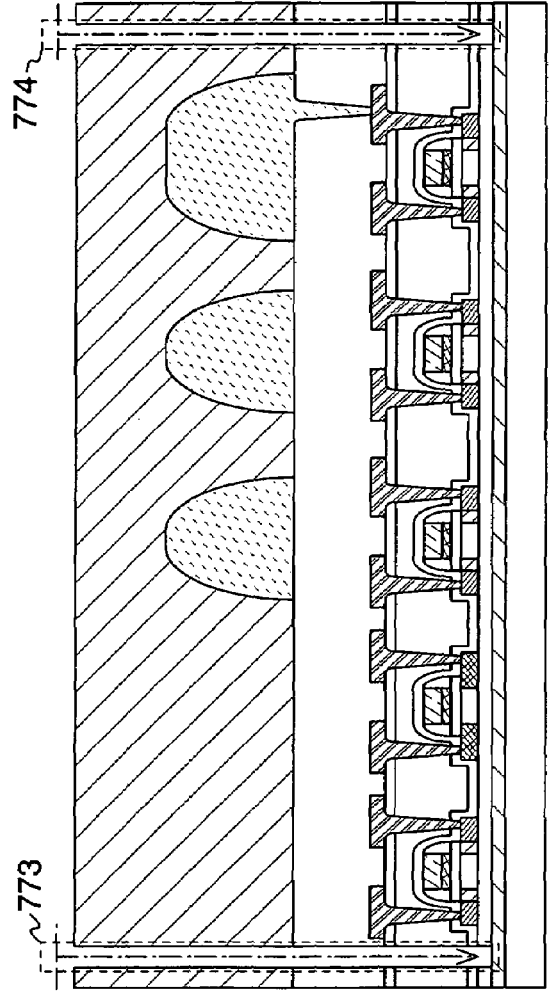
FIGS. 5A and 5B are cross sectional views showing Embodiment Mode 1.

Next, the insulating film is etched to expose the separation layer 12 to form opening portions 773 and 774 (FIG. 5A). Providing the opening portions 773 and 774 makes it possible to easily separate an element from the substrate 11 in a subsequent separating step. Further, the opening portions 773 and 774 are preferably provided in a region in which elements such as the thin film transistors included in the element layer 14 are not provided or edge regions of the substrate 11. The openings 773 and 774 can be formed by photolithography, irradiation of laser light (for example, UV light), or grinding and cutting of an end surface of a sample.

Figure 5B:
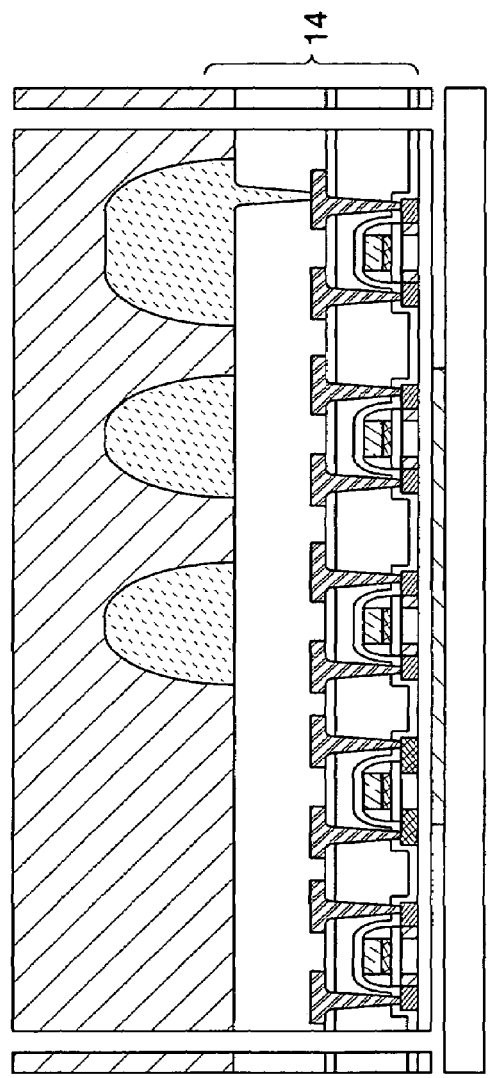

Next, an etching agent is introduced in the opening portions 773 and 774 to remove the separation layer 12 (FIG. 5B), if required. By removing the separation layer 12, the element can be separated from the substrate 11 more easily in the subsequent separating step; however, this step of removing the separation layer may be omitted. As the etching agent, a gas or a liquid containing halogen fluoride is used. As a gas containing halogen fluoride, for example, chlorine trifluoride ($ClF_3$) gas can be used. When the etching agent is introduced in the opening portions, the element layer 14 can be separated from the substrate 11. Note that the element layer 14 indicates a layer including the thin film transistors 744 to 748 and the conductive film 786 serving as the antenna. Further, the separation layer 12 may be partly left rather than being removed entirely. By leaving part of the separation layer 12, consumption of the etching agent can be suppressed and a processing time required for removing the separation layer can be shortened, thereby reducing cost and realizing high efficiency. In addition, after removing the separation layer 12, the element layer 14 can be kept over the substrate 11 by part of the remaining separation layer 12.

Note that this embodiment mode employs a method in which after forming the opening portions 773 and 774, the etching agent is introduced in the opening portions 773 and 774 to remove the separation layer 12. Alternatively, a stacked body including the base film 13, the element layer 14, and the protection layer 15 may be separated from the substrate 11 by using the other method. For example, it is possible to use a method in which after forming opening portions by using a laser or a cutter to reach the separation layer 12, the stacked body may be separated from the substrate 11 by using a physical means. The phrase "being separated by a physical means" indicates separation caused by applying stress from an external portion. For example, there is a separation method by which stress is applied using wind pressure of a gas jetted from a nozzle, ultrasonic waves, or the like.

The substrate 11 separated from the element layer 14 is preferably reused to reduce cost. Further, the insulating film 15 is formed to prevent the element layer 14 from being scattered after removing the separation layer 12. Since the element layer 14 is small, thin, and lightweight, after removing the separation layer 12, the element layer is easily scattered because the element layer is not firmly attached to the substrate 11. However, by forming the insulating film 15 over the element layer 14, the element layer 14 is weighted, making it possible to prevent the element layer from scattering from the substrate 11. Further, although only the element layer 14 is thin and lightweight, when the insulating film 15 is formed thereover, the element layer 14 can secure a certain degree of strength without having a shape that the element layer 14 separated from the substrate 11 is rolled up due to stress and the like.

Next, one surface of the insulating film 15 is attached to a first sheet material 775 and then the element layer is completely separated from the substrate 11 (FIG. 6A). In a case where part of the separation layer 12 is left rather than removing the separation layer entirely, the element layer is separated from the substrate 11 by using a physical means. Subsequently, a second sheet material 776 is provided to the other surface of the insulating film 15 opposite to the surface of the insulating film 15 attached with the first sheet material 775, and thereafter, the second sheet material 776 is attached thereto by performing one or both of heat treatment and pressure treatment. At the same time of or after providing the second sheet material 776, the first sheet material 775 is separated and then a third sheet material 777 is provided instead of the first sheet material. Then, by performing one or both of heat treatment and pressure treatment, the third sheet material 777 is attached to the insulating film 15. Consequently, a semiconductor device in which the element layer 14 is sealed with the second sheet material 776 and the third sheet material 777 can be completed (FIG. 6B).

Note that the element layer 14 may be sealed with the first sheet material 775 and the second sheet material 776. However, in a case where a sheet material used for separating the element layer 14 from the substrate 11 is different from sheet materials used for sealing the element layer 14, the second sheet material 776 and the third sheet material 777, which are made from the same material, may be used to seal the element layer 14 as described above. This is effective in a case of utilizing a sheet material with weak adhesion, and for example, in a case where there is a probability that the first sheet material 775 is also attached to the substrate 11 in addition to the element layer 14 when separating the element layer 14 from the substrate 11.

As each of the first sheet material 775, the second sheet material 776, and the third sheet material 777, a film made from polypropylene, polyester, vinyl, polyvinyl fluoride, or vinyl chloride, a paper made from a fibrous material; a stacked film of a base material film (such as polyester, polyamide, an inorganic evaporation film, or paper) and an adhesive synthetic resin film (such as an acrylic synthetic resin or an epoxy synthetic resin); or the like can be used. Further, when a film is attached to the element layer by performing both of heat treatment and pressure treatment, an adhesive layer provided on a top surface of the film or a layer (which is not an adhesive layer) provided in an outermost part of the film is melted by the heat treatment, and then attached by the pressure treatment. Furthermore, adhesive layers may be or are not required to be provided over surfaces of the second sheet material 776 and the third sheet material 777. The adhesive layers correspond to layers each containing an adhesive agent such as a heat curing resin, an ultraviolet curing resin, an epoxy resin adhesive agent, or a resin additive agent. In order to prevent intrusion of moisture and the like into an interior portion after sealing, sheet materials used for sealing the element layer are preferably subjected to silica coating. For example, sheet materials in each of which an adhesive layer, a film made from polyester or the like, and a silica coat are stacked, can be used.

Through the above described steps, a flexible semiconductor device can be manufactured. By using the method described in this embodiment mode, a width between lines of the antenna of the conductive film (antenna) can be narrowed as 20±5 μm while maintaining a short processing time required for forming the antenna, and therefore, a region per unit area where the antenna can be formed can be increased. Accordingly, a semiconductor device including the antenna has an improved communication distance along with high reliability.

Embodiment Mode 2

In this embodiment mode, a method for manufacturing a semiconductor device, which is different from the method described in Embodiment Mode 1, will be described with reference to the drawings.

Although a case of forming the antenna in the interior portion of the element layer along with the thin film transistors, is described in Embodiment Mode 1, a method for forming a semiconductor device where an antenna is separately formed from thin film transistors and then the antenna and the thin film transistors are electrically connected to each other, will be described in this embodiment mode.

First, a substrate over which an antenna is provided, is previously formed. A method for forming the substrate over which the antenna is provided, will be described below.

A conductive film is formed over a substrate 235 by coating. Alternatively, in order to prevent part of a substrate 235 from being etched in patterning the conductive film by laser irradiation in a subsequent step, a conductive film may be formed over the insulating film by coating after forming the insulating film over the substrate 235. Note that a glass substrate, a quartz substrate, a ceramic substrate, a metal substrate containing stainless steel, a silicon substrate, a semiconductor substrate having a surface formed with an insulating film, a plastic substrate typified by an acrylic substrate, or the like can be used as the substrate 235.

The conductive film can be formed by using a fluid containing conductive particles and employing any one of methods of screen printing, spin coating, dipping, and a droplet discharging method using an ink-jet technique or the like. Further, the conductive film may be formed using CVD, sputtering, plating, or evaporation. In this case, the conductive film can be made from any one of Au, Ag, Cu, Ni, Pt, Pd, Ir, Rh, W, Al, Ta, Mo, Cd, Zn, Fe, Ti, Zr, and Ba, or an alloy or a compound thereof. Further, the conductive film can also be formed using polycrystalline Si or polycrystalline Ge doped with an impurity element such as phosphorus. In this embodiment mode, the conductive film is formed by screen printing. Note that any conditions of screen printing, any conductive particles, and the like described in Embodiment Mode 1 may be used.

Next, the fluid containing the conductive particles applied over the substrate is baked and cured to form a conductive film 236 (FIG. 7A). Subsequently, the conductive film is subjected to patterning (scribing) by irradiation of a laser beam to form a wiring 237 (FIG. 7B). The wiring 237 serves as an antenna.

A width between lines of the wiring (antenna) 237 formed by this method is as narrow as 20±5 μm, and therefore, a region per unit area in which the antenna can be formed, can be increased. As a consequence, resistance of the antenna can be reduced, thereby improving a communication distance of a wireless chip. Moreover, a processing time required for forming the antenna can be extremely shortened as compared with a case of employing a patterning method using a mask made from a resist.

As described above, a substrate over which the antenna is provided, is completed.

Next, a method for forming a substrate over which an element layer is formed, will be described. First, as described in Embodiment Mode 1 with reference to FIGS. 1A to 1C and FIGS. 2A to 2C, the conductive films 752 to 761 are formed over the substrate 11 (FIG. 2C). Subsequently, an insulating film 262 is formed over the conductive films 752 to 761 and the insulating film 751 (FIG. 8A). The insulating film 262 is formed to have a single layer or a stacked layer by using an inorganic material or an organic material by SOG, a droplet discharging method, or the like. In this embodiment mode, the insulating film 262 is formed with a thickness of 0.75 to 3 μm.

Next, the insulating film 262 is etched by photolithography to form contact holes through which the conductive film 752 and the conductive film 761 are exposed. Subsequently, a conductive film is formed over a top surface of the insulating film 762 to fill the contact holes. This conductive film may be formed using a material which can also be used for forming the conductive films 752 to 761 described in Embodiment Mode 1.

Next, the conductive film is subjected to patterning to form a wiring 281 being connected to the conductive film 752 and a wiring 282 being connected to the conductive film 761.

As described above, the substrate over which the element layer is formed, is completed. Although the substrate over which the antenna is provided is first formed in this embodiment mode, the order of forming the substrate over which the antenna is provided and the substrate over which the element layer is provided may be arbitrarily changed.

Afterwards, the substrate over which the element layer is provided and the substrate over which the antenna is provided are attached to each other (FIG. 8B). In this embodiment mode, as a means for attaching these substrates, an anisotropic conductor 239 in which electric conductors 238 are dispersed is used. The anisotropic conductor 239 can be pressed and made electric connection by the thicknesses of the wiring 281 (wiring 282) and the antenna 234 at a region where the wiring 281 (wiring 282) and the antenna 234 are provided. In the other region, since the electric conductors 238 keep a sufficient gap, these substrates are not electrically connected to each other in a region other than the region where the electric connection is made. Note that in addition to the method by which the substrates are attached to each other by using the anisotropic conductor, a method by which metal and metal are attached to each other by ultrasonic waves (also referred to as "ultrasonic wave junction") or an attaching method using an ultraviolet curing resin or a two-sided tape can be used.

As described above, a substrate (hereinafter, referred to as an attached substrate 240) in which the substrate over which the element layer is provided and the substrate over which the antenna is provided are attached to each other is completed.

Figure 9A:
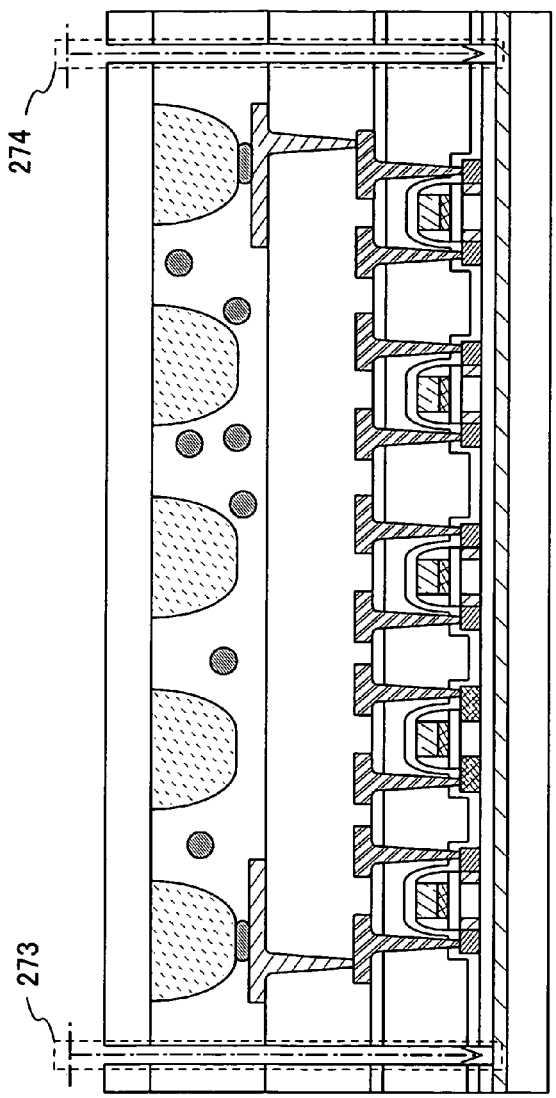
FIGS. 9A and 9B are cross sectional views showing Embodiment Mode 2.

Next, the insulating film is etched to expose the separation layer 12 to form opening portions 273 and 274 (FIG. 9A). The opening portions 273 and 274 are provided in a region where the thin film transistors and the like included in the element layer 14 are not provided, or end portions of the substrate 11.

Further, the openings portions 273 and 274 can be formed by photolithography, laser irradiation, or grinding and cutting an end surface of a sample.

Figure 9B:
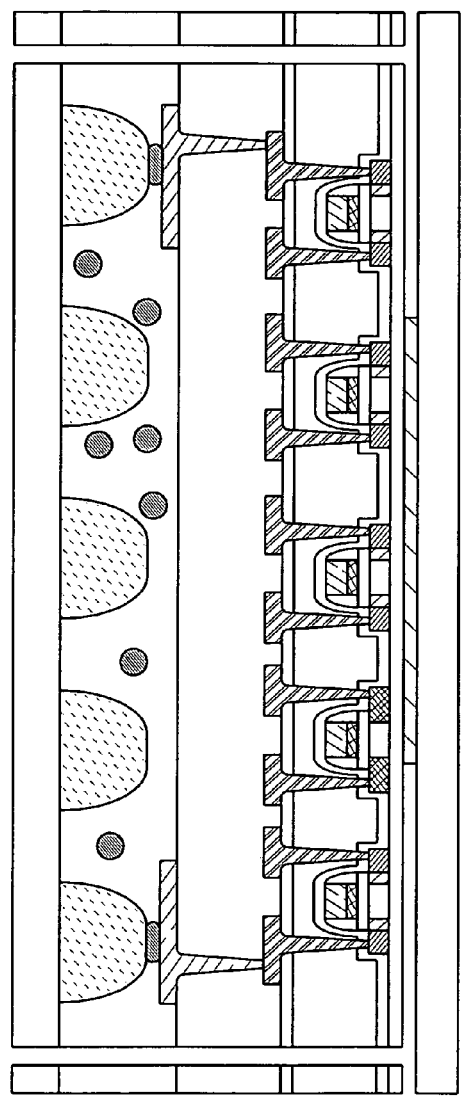

Next, an etching agent is introduced to the opening portions 273 and 274 to remove the separation layer 12 (FIG. 9B), if required. As the etching agent, a gas or a liquid containing halogen fluoride is used. As a gas containing halogen fluoride, for example, chlorine trifluoride ($ClF_3$) gas can be used. When the etching agent is introduced to the opening portions 273 and 274, the element layer 14 is separated from the substrate 11. Further, the separation layer 12 may be partly left rather than being removed entirely. By leaving part of the separation layer 12, consumption of the etching agent can be suppressed and a processing time required for removing the separation layer can be shortened, thereby reducing cost and realizing high efficiency. In addition, even after removing the separation layer 12, the element layer 14 can be kept over the substrate 11 by part of the remaining separation layer 12.

The substrate 11 separated from the element layer 14 is preferably reused to reduce cost. Further, the insulating film 15 is formed to prevent the element layer 14 from being scattered after removing the separation layer 12. Since the element layer 14 is small, thin, and lightweight, after removing the separation layer 12, the element layer 14 is not firmly attached to the substrate 11 so that it is easily scattered. However, by forming the insulating film 15 over the element layer 14, the element layer 14 is weighted, making it possible to prevent the element layer 14 from scattering from the substrate 11. Further, although only the element layer 14 is thin and lightweight, when the insulating film 15 is formed thereover, the element layer 14 can secure a certain degree of strength without having a shape that the element layer 14 separated from the substrate 11 is rolled up due to stress and the like.

Next, the substrate 235 having the element layer 14 is completely separated from the substrate 11 (FIG. 10A). When part of the separation layer 12 is remained over the substrate 235, the element layer 14 is completely separated from the substrate 11 by using a physical means.

Then, the substrate 235 having the element layer 14, which is separated from the substrate 11, is sealed with a first sheet material 276 and a second sheet material 277 (FIG. 10B). Note that, prior to sealing the element layer 14, a protection film may be provided to cover a surface of the substrate 235 for the antenna so as to protect the element layer.

The first sheet material 276 and the second sheet material 277 can be attached to the element layer 14 by performing one or both of heat treatment and pressure treatment. As each of the first sheet material 276 and the second sheet material 277, a film made from polypropylene, polyester, vinyl, polyvinyl fluoride, or vinyl chloride, a paper made from a fibrous material; a stacked film of a base material film (such as polyester, polyamide, an inorganic evaporation film, or paper) and an adhesive synthetic resin film (such as an acrylic synthetic resin or an epoxy synthetic resin); or the like can be used. Further, when a film is attached to the element layer by performing both of heat treatment and pressure treatment, an adhesive layer provided on a top surface of the film or a layer (which is not an adhesive layer) provided in an outermost part of the film is melted by the heat treatment, and then attached by the pressure treatment. Furthermore, adhesive layers may be or are not required to be provided over surfaces of the first sheet material 276 and the second sheet material 277. The adhesive layers correspond to layers each containing an adhesive agent such as a heat curing resin, an ultraviolet curing resin, an epoxy resin adhesive agent, or a resin additive agent.

In order to prevent intrusion of moisture and the like into an interior portion after sealing, sheet materials used for sealing the element layer are preferably subjected to silica coating. For example, sheet materials in each of which an adhesive layer, a film made from polyester or the like, and a silica coat are stacked, can be used.

Next, the substrate sealed with the first sheet material 276 and the second sheet material 277 is divided into plural chips. As a method for dividing the substrate into plural chips, for example, a laser oscillation apparatus is used as a heating means and the periphery of each chip is irradiated with a laser beam through the second sheet material so that the substrate is divided into the plural chips.

Further, as a heating means other than a laser beam, a wire may be used. Specifically, by pressing a heated wire to the periphery of a portion, which will be each chip later, the periphery thereof may be melted and sealed, and then cut.

Through the above described steps, a flexible semiconductor device (chip) is completed. By using the method described in this embodiment mode, the conductive film (antenna) formed having narrow width between lines of the antenna as 20±5 µm while maintaining a short processing time required for forming the antenna, and therefore, a region per unit area where the antenna can be formed can be increased. Accordingly, a semiconductor device having the antenna has an improved communication distance along with high reliability.

This embodiment mode can be implemented by being freely combined with the above embodiment mode. That is, the materials and forming methods shown in the above embodiment mode can be freely combined in this embodiment mode.

Embodiment Mode 3

In this embodiment mode, a method for manufacturing a semiconductor device, which is different from the methods described in Embodiment Modes 1 and 2, will be described with reference to the drawings. Differing from Embodiment Modes 1 and 2, in each of which the substrate 11 is removed in the subsequent step, the substrate 11 is ground and polished instead of removing the substrate 11 to be used as part of the semiconductor device.

First, a base film 13 is formed over a substrate 11. Subsequently, an element layer 14 is formed over the base film 13. Differing from Embodiment Modes 1 and 2, the separation layer 12 is not provided over the substrate 11 and the base film 13 is directly formed on the substrate 11 in this embodiment mode.

Note that an antenna may be formed inside of the element layer 14 as described in Embodiment Mode 1. Alternatively, after forming the element layer 14, a thin film transistor provided in an element layer and a substrate over which an antenna is provided may be electrically connected to each other, as described in Embodiment Mode 2. In this embodiment mode, after forming the antenna inside of the element layer 14, an insulating film (protection layer) 15 is provided over the element layer 14.

Next, a film 41 is formed over the insulating film 15. The film 41 is made from a vinyl chloride resin, a silicon resin, or the like and has a property of being expanded when it is pulled out. Therefore, the film 41 is also referred to as an expand film. Preferably, the film 41 has a strong adhesive property in a normal state and when the film 41 is irradiated with light, the adhesive property is weakened. Specifically, it is preferable to use an UV tape whose adhesive property is weakened when being irradiated with ultraviolet light.

Figure 11A:
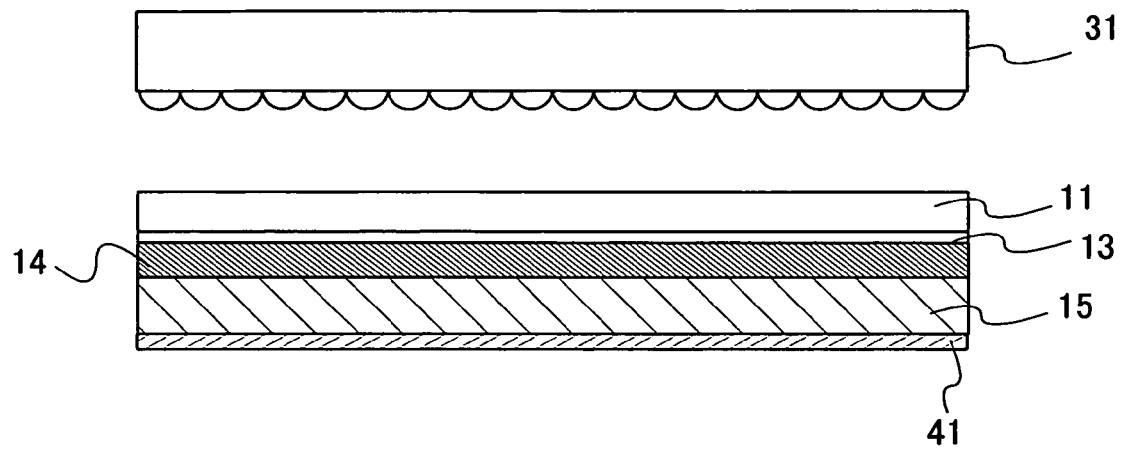
FIGS. 11A to 11C are cross sectional views showing Embodiment Mode 3.

Next, one surface of the substrate 11 opposite to the other surface of the substrate over which the element layer is provided is ground by a grinding means (see FIG. 11A). Preferably, the surface of the substrate 11 is ground until the substrate 11 has a thickness of 100 μm or less. In general, in this grinding step, the surface of the substrate 11 is ground by rotating one or both of a stage to which the substrate is fixed and the grinding means 31. The grinding means 31 corresponds to a grinding stone, for example.

Figure 11B:
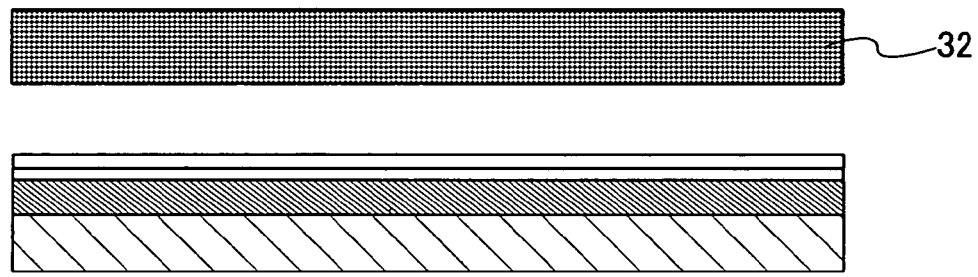

Next, the surface of the substrate 11, which is ground, is polished by a polishing means (see FIG. 11B). Preferably, the surface of the substrate 11 is polished such that the substrate has a thickness of 2 to 50 μm, and more preferably, 4 to 30 μm. In this polishing step, the surface of the substrate 11 is polished by rotating one or both of the stage to which the substrate 11 is fixed and the polishing means 32 in the similar manner as the above described grinding step. The polishing means 32 corresponds to a polishing pad, for example. Thereafter, to remove dust generated in the grinding and polishing steps, washing is performed if required, though not shown in the drawings.

Figure 11C:
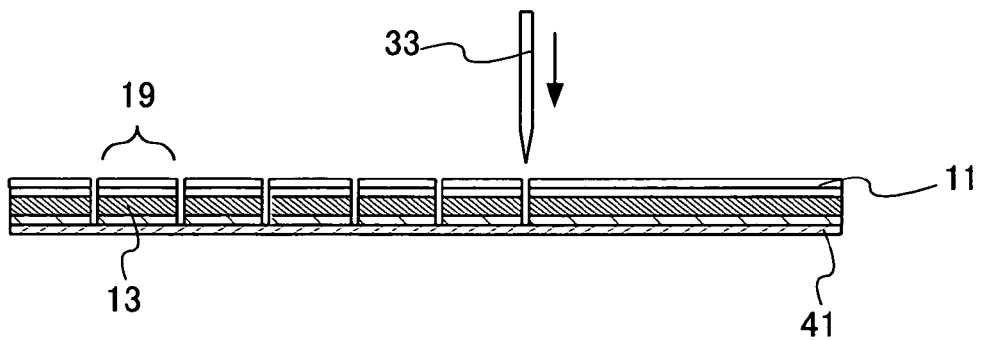

Then, the substrate 11, the base film 13, the element layer 14, and the insulating film 15 are partly cut by a cutting means 33. In this case, they are cut along a boundary line between integrated circuits such that each of a plurality of integrated circuits is independently divided without cutting the film 41. Further, only the insulating film provided in the element layer 14 is cut without cutting elements provided in the element layer 14. Through this cutting step, a plurality of semiconductor devices (chips) 19 in each of which the substrate 11 whose thickness is reduced, the base film 13, and the element layer 14 are stacked, is formed (see FIG. 11C). Note that the cutting means 33 corresponds to a dicer, a laser, a wire saw, or the like. The substrate 11 whose thickness is reduced to 2 to 50 μm (preferably, 4 to 30 μm) has flexibility so that the semiconductor devices 19 thus completed have also flexibility. Accordingly, the semiconductor devices 19 manufactured in this embodiment mode can be easily attached to a material body having curvature.

This embodiment mode can be implemented by being freely combined with the above embodiment modes. That is, the materials and forming methods shown in Embodiment Modes 1 and 2 described above can be freely combined in this embodiment mode.

Embodiment Mode 4

This embodiment mode will describe a method for manufacturing a thin film transistor having a structure, which is different from the thin film transistors of the element layer 14 described in Embodiment mode 1.

First, as described in Embodiment Mode 1, a separation layer 12, a base film 13, and an amorphous semiconductor film 704 are formed over a substrate 11. Subsequently, after crystallizing the amorphous semiconductor film 704, patterning is carried out to form crystalline semiconductor films 706 to 710. Then, a gate insulating film 705 is formed to cover the crystalline semiconductor films 706 to 710. A first conductive film 1505a and a second conductive film 1506a are stacked over the gate insulating film 705. Note that in this embodiment mode, only the crystalline semiconductor film 706 is shown and will be described (FIG. 15A).

Each of the first conductive film 1505a and the second conductive film 1506a can be formed by using high melting point metal such as tungsten (W), chromium (Cr), tantalum (Ta), tantalum nitride (TaN), or molybdenum (Mo), or an alloy or a compound mainly containing high melting point metal. In this embodiment mode, the first and second conductive films are formed using different materials from each other such that difference in etching rate will be generated in an etching step performed later. Specifically, a tantalum nitride film is formed with a thickness of 30 to 50 nm as the first conductive film whereas a tungsten film is formed with a thickness of 300 to 600 nm as the second conductive film.

Figure 15A:
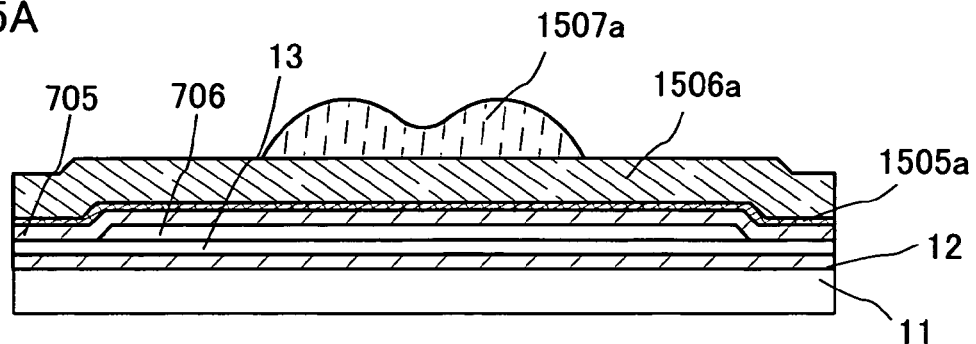
FIGS. 15A to 15D are diagrams showing Embodiment Mode 4.

Next, a diffraction grating pattern or a mask pattern formed using an exposure mask to which an auxiliary pattern made from a semipermeable film having a function of attenuating light intensity is placed, is formed over the second conductive film (FIG. 15A). Here, a method for forming a mask pattern 1507a will be described with reference to FIGS. 17A to 17D.

Figure 17A:
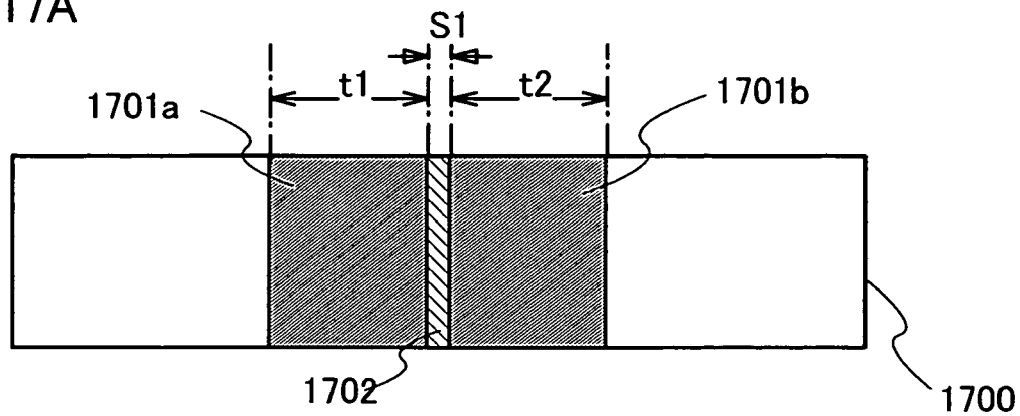
FIGS. 17A to 17C are diagrams showing Embodiment Mode 4.
Figure 17B:
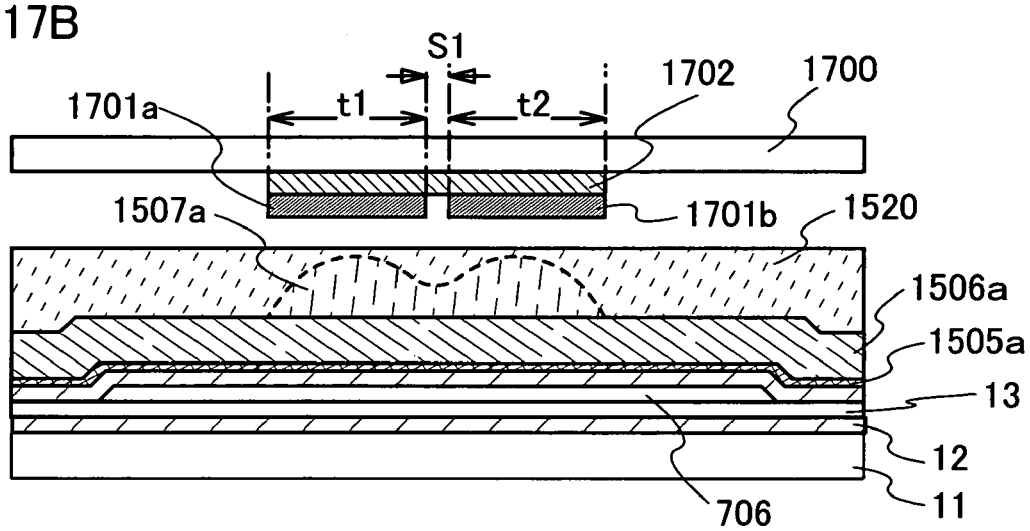

FIG. 17A is a top view enlarging part of the exposure mask. Further, FIG. 17B is a cross sectional view of part of the exposure mask corresponding to FIG. 17A. In FIG. 17B, the exposure mask corresponds to the substrate 11 over which a resist is applied.

The exposure mask has light shielding portions 1701a and 1701b made from a metal film such as chromium (Cr), tantalum (Ta), or CrNx, and a semipermeable film 1702 as an auxiliary pattern, over a light-transmitting base substance 1700. A width of the light shielding portion 1701a is set to be t1, a width of the light shielding portion 1701b is set to be t2, and a width of a portion 1702 where the semipermeable film is provided is set to be S1. Note that a space between the light shielding portion 1701a and the light shielding portion 1701b can also be set to be S1.

In this embodiment mode, as the exposure mask, an exposure mask including the semipermeable film 1702 made from $MoSi_xN_y$ (x and y are positive integers) and the light shielding portions 1701a and 1701b made from chromium (Cr) over the light-transmitting base substance 1700 is used. Further, a material for the semipermeable film 1702 may be arbitrarily selected with respect to each exposure wavelength. For example, when using an $F_2$ excimer laser, $TaSi_xO_y$ (x and y are positive integers) may be used. When using an ArF excimer laser, $MoSi_xN_y$ or $TaSi_xO_y$ may be used. Further, when using i-line (light with a wavelength of 365 nm), $CrO_xN_y$ (x and y are positive integers) may be used. When using an ArF excimer laser, $CrF_xO_y$ (x and y are positive integers) or $MoSi_xO_y$ (x and y are positive integers) may be used.

When a resist film is exposed to light by using the exposure mask shown in FIGS. 17A and 17B, light is transmitted around the light shielding portions and through the semipermeable film so that a non-exposed region 1507a and an exposed region 1520 are formed.

Subsequently, development is performed to remove the exposed region 1520 so that a mask pattern 1507a shown in FIG. 15A is obtained. Note that after the development, baking at a temperature of about 200° C. may be performed to change a shape of the mask pattern 1507a.

Figure 17C:
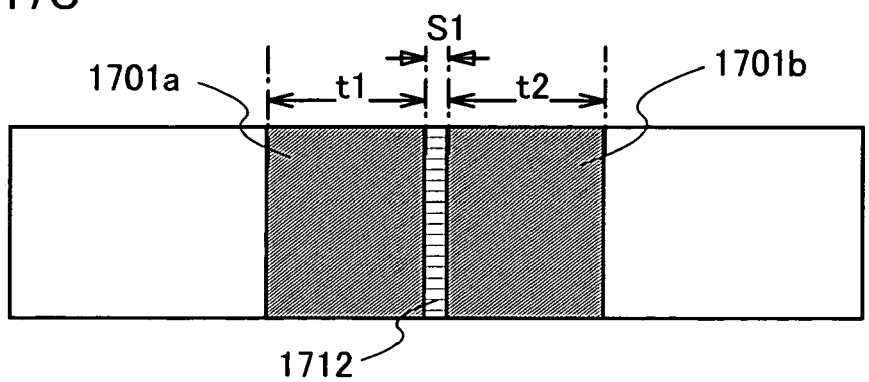

Further, as an example of other exposure mask, FIG. 17C shows a top view of an exposure mask in which a diffraction grating pattern 1712 having a plurality of slits provided at an interval of exposure limit or less is provided between the light shielding portions 1701a and 1701b. For example, an exposure mask in which t1 is set to be 6 μm; t2, 6 μm; and S1, 1 μm, is used. Similarly, the mask pattern 1507a shown in FIG. 17A can also be obtained even when using the exposure mask shown in FIG. 17C.

Next, the first conductive film 1505a and the second conductive film 1506a are patterned by using the mask pattern 1507a.

Figure 15B:
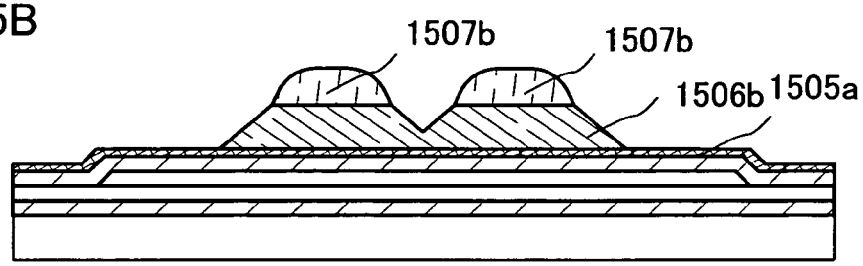

First, as shown in FIG. 15B, the second conductive film 1506a is etched by dry etching. As etching gases, $CF_4$, $SF_6$, $Cl_2$, or $O_2$ is used. In order to improve an etching rate, a dry etching apparatus using a high-density plasma source such as ECR (electron cyclotron resonance) or ICP (inductively coupled plasma) is used. Further, in a processing shape based on the mask pattern 1507a, in order to process an end portion or a sidewall portion into a tapered shape, negative bias voltage is applied to a substrate side. By the etching, the mask pattern 1507a made from a resist is subjected to sputtering with ions accelerated by electric field so that mask patterns 1507b, which are separately placed, are formed.

Figure 15C:
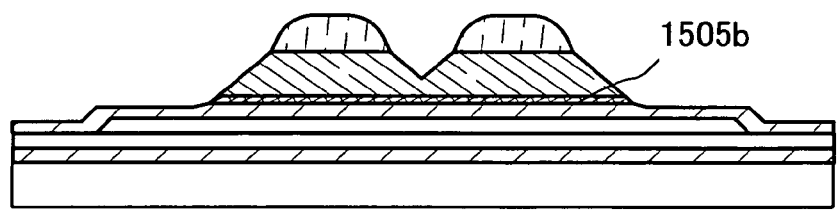

Next, the etching gases are changed to $CF_4$ and $Cl_2$, and then etching of tantalum nitride of the first conductive film 1505a is performed. By the etching, a first conductive stacked pattern including the first conductive film 1505b and the second conductive film 1506b is formed (FIG. 15C). An angle of a tapered portion at an end portion of the second conductive film 1506b and a surface of the substrate 11 is set to be 10 to 30 degrees. This angle is mainly determined in accordance with a thickness of the second conductive film 1506b. In this embodiment mode, a length of the tapered portion is set to be 0.2 to 1.5 μm, and preferably, 0.5 to 1 μm.

Figure 15D:
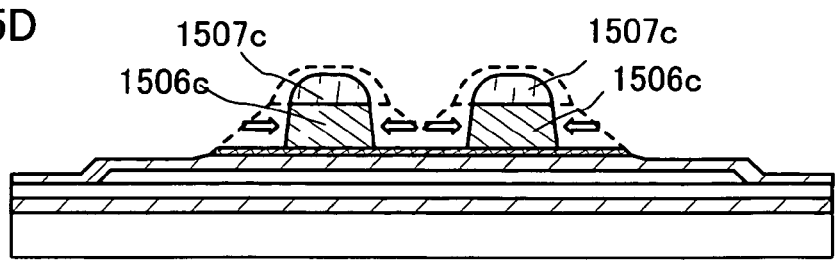

Next, by using $BCl_3$, $Cl_2$, and $O_2$ as etching gases, the second conductive film 1506b is selectively etched based on the mask pattern 1507b to form a second conductive film 1506c. The mask pattern 1507b made from a resist is subjected to sputtering with ions accelerated by electric field and the size of the mask pattern 1507b is reduced to form a mask pattern 1507c. Further, in this etching, bias voltage applied to a substrate side is reduced so as to prevent the first conductive film 1505b from being etched. An end portion of the second conductive film 1506c is recessed to be inside of the first conductive film 1505b and then a length of Lov is determined by the amount of recess as described later. Note that Lov is a region where the crystalline semiconductor film 706 is overlapped with the first conductive film 1505b, which is not covered with the second conductive film 1506c. A second conductive stacked pattern including the first conductive film 1505b and the second conductive film 1506c is formed in such a manner and becomes a gate electrode at an intersection with the crystalline semiconductor film 706 (FIG. 15D). Accordingly, an interval between two channel formation regions can be set to be not more than 2 μm. According to the present invention, an area occupied by TFTs having a multi-gate structure can be reduced and the TFTs can be integrated, thereby realizing a high-definition light emitting device.

Next, an impurity element imparting one conductivity type is added to the crystalline semiconductor film 706. In this case, an LDD region, a source region, and a drain region can be formed in a self-aligning manner by using the second conductive stacked pattern.

Figure 16A:
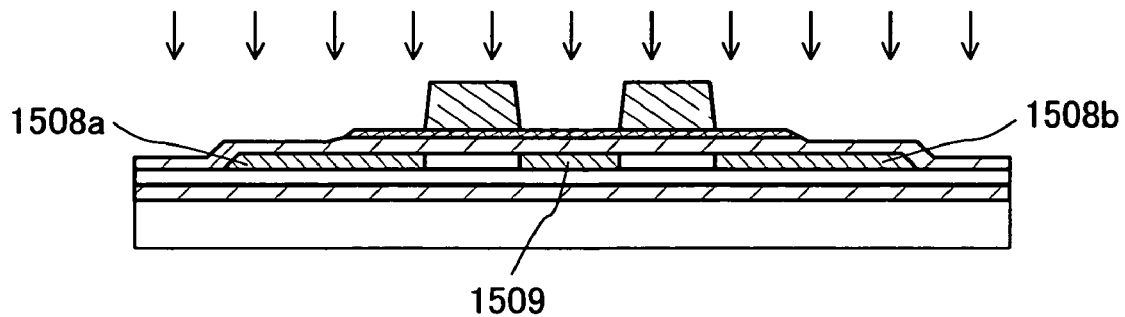
FIGS. 16A to 16C are cross sectional views showing Embodiment Mode 4.

FIG. 16A is a cross sectional view showing doping treatment for forming an LDD region overlapping with a gate electrode. An impurity element imparting one conductivity type is added into the crystalline semiconductor film 706 underlying the second conductive film 1506c. By adding the impurity element imparting one conductivity type, first concentration impurity regions 1508a, 1508b, and 1509 are formed. In this case, the impurity element imparting one conductivity type is added into the crystalline semiconductor film 706 by passing through part of the first conductive film 1505b which is not overlapped with the second conductive film 1506c. In this embodiment mode, phosphorus (or As) is used as the impurity element imparting one conductivity type to form an N-channel TFT. Accelerating voltage equal to or more than 50 kV is required to form the first concentration impurity regions 1508a, 1508b, and 1509, though it is depending on a thickness of the gate insulating film 705 or the first conductive film 1505b. When the first concentration impurity regions 1508a, 1508b, and 1509 serve as LDD regions, an impurity concentration thereof may be adjusted to be $1\times10^{16}$ to $5\times10^{18}/cm^3$ (a peak value in an SIMS measurement).

When performing the doping treatment, the impurity element imparting one conductivity type is not added into a region of the crystalline semiconductor film 706 underlying the second conductive film 1506c and this region becomes a portion serving as a channel formation region of a TFT, which will be formed later. A plurality of regions which are not added with the impurity element imparting one conductivity type is formed in the crystalline semiconductor film 706, and in this embodiment mode, two regions are formed. In this specification, an impurity region sandwiched between the plurality of regions (channel formation regions), which is the two regions in this case, is referred to as an intermediate impurity region.

Figure 16B:
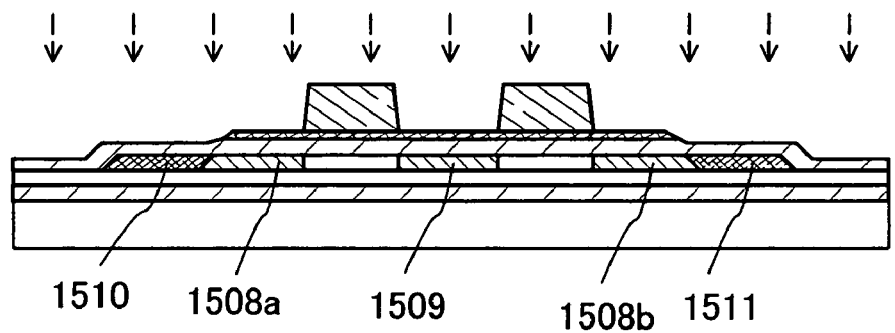

FIG. 16B is a cross sectional view showing doping treatment for forming a source region and a drain region positioned outside of a gate electrode. An impurity element imparting one conductivity type is added into the crystalline semiconductor film 706 while utilizing the second conductive stacked pattern as a mask. By adding the impurity element imparting one conductivity type, second concentration impurity regions 1510 and 1511 are formed. The doping treatment for forming a source region and a drain region is performed at accelerating voltage of 30 kV or less. An impurity concentration of the second concentration impurity region 1510 may be adjusted to be $1\times10^{19}$ to $5\times10^{21}/cm^3$ (a peak value in an SIMS measurement).

Figure 16C:
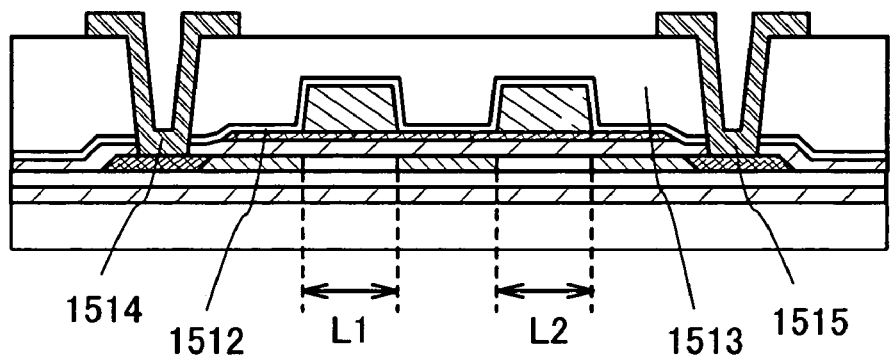

Note that the order of the doping treatment is not particularly limited. After performing the doping treatment for forming a source region and a drain region, the doping treatment for forming an LDD region may be performed. Further, in this embodiment mode, doping treatments are performed two times to form impurity regions having different concentrations; however, the impurity regions having different concentrations may be formed by doping treatment once by adjusting a treatment condition. Then, the insulating film 1512 and the insulating film 1513 are formed over the TFT, contact holes connecting to second concentration impurity regions 1510 and 1511 are fomed in the insulating films 1512 and 1513, and conductive films 1514 and 1515 each serving as a source wiring or a drain wiring are formed (FIG. 16C).

Through the above described steps, a thin film transistor in which an interval between two channel formation regions is less than 2 μm, can be completed. According to the present invention, an area occupied by TFTs having a multi-gate structure can be reduced and the TFTs can be integrated, thereby realizing a high-definition light emitting device.

This embodiment mode can be implemented by being freely combined with the above embodiment modes. That is, the materials and forming methods shown in Embodiment Modes 1 to 3 shown above can be freely combined in this embodiment mode.

Embodiment Mode 5

In this embodiment mode, one embodiment mode of a case where a semiconductor device according to the present invention is used as an RFID tag, which is capable of transmitting and receiving data without contact, will be explained with reference to FIGS. 12A to 12C.

Figure 12A:
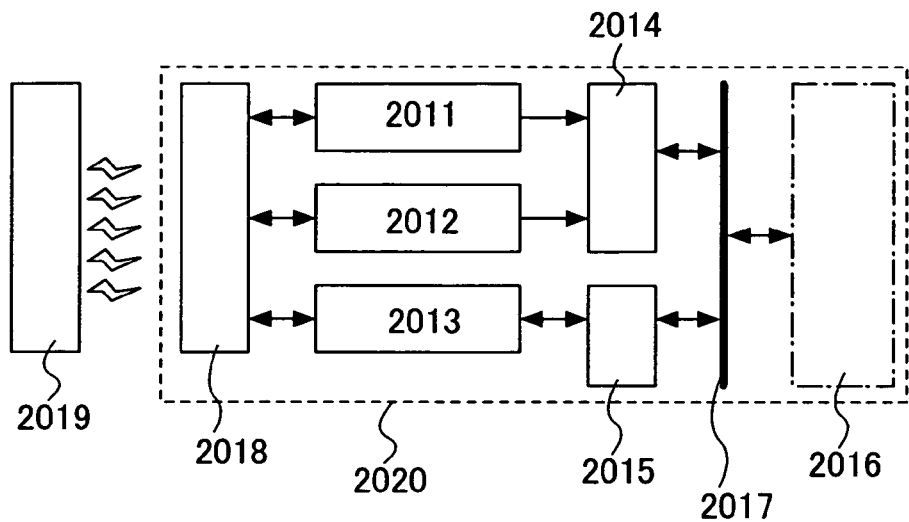
FIGS. 12A to 12C are diagrams showing Embodiment Mode 5.
Figure 12B:
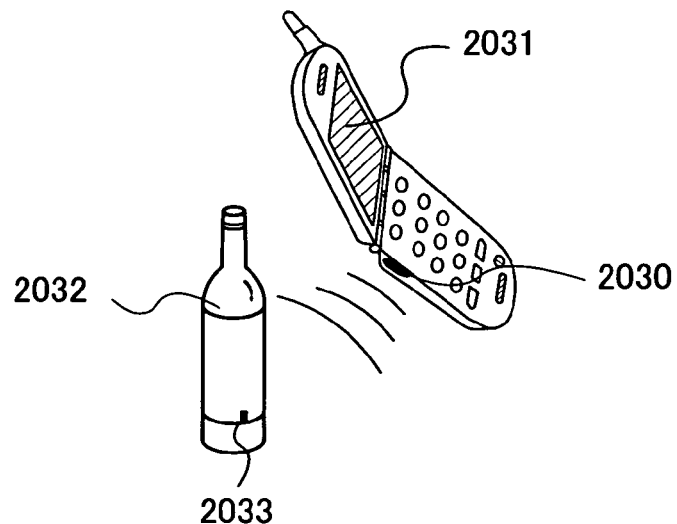
Figure 12C:
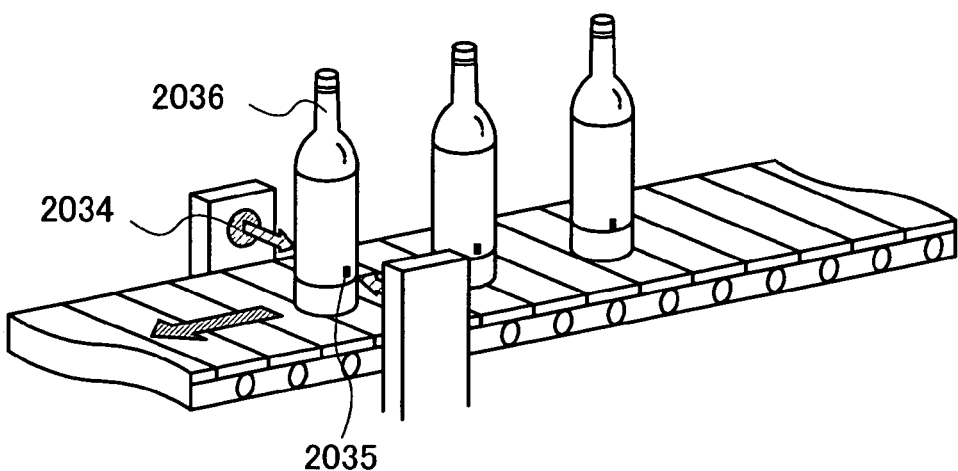

An RFID tag 2020 has a function of communicating data without contact, which includes a power supply circuit 2011, a clock generating circuit 2012, a data demodulation/modulation circuit 2013, a control circuit 2014 for controlling another circuit, an interface circuit 2015, a memory 2016, a data bus 2017, and an antenna (antenna coil) 2018 (FIG. 12A).

The power supply circuit 2011 serves to generate power sources supplied for respective circuits in a semiconductor device based on AC signals inputted from the antenna 2018. The clock generating circuit 2012 serves to generate clock signals supplied for respective circuits in a semiconductor device based on AC signals inputted from the antenna 2018. The data demodulation/modulation circuit 2013 serves to demodulate and modulate data for communicating with a reader/writer 2019. The control circuit 2014 serves to control the memory 2016. The antenna 2018 serves to transmit and receive radio waves. The reader/writer 2019 controls a semiconductor device, communication with the semiconductor device, and processing of data thereof. Note that the RFID tag is not limited to this constitution and another element such as a limiter circuit of power source voltage and hardware dedicated to cryptanalysis may be additionally provided, for example.

In addition, the RFID tag may be a type in which power source voltage is supplied to each circuit by radio waves without mounting a power source (a battery), a type in which power source voltage is supplied to each circuit by a power source (a battery) mounted instead of an antenna, or a type in which power source voltage is supplied by radio waves and a power source.

In the case of using a semiconductor device according to the present invention to an RFID tag or the like, it is advantageous in that non-contact communication is possible, multiple reading is possible, data writing is possible, transformation into various shapes is possible, directivity is wide and a wide recognition range is provided depending on the selected frequency, or the like. An RFID tag can be applied to an IC tag which can identify individual information of a person or an object by non-contact wireless radio communication, an adhesive label which can be attached to an object by label processing, a wristband for an event or amusement, or the like. In addition, an RFID tag may be processed with a resin material or may be directly fixed to a metal obstructing wireless radio communication. Further, an RFID tag can be utilized for an operation of a system such as an entrance management system and checkout system or an adjustment system.

Next, one mode of the practical use of the RFID tag using a semiconductor device according to the present invention will be explained below. A reader/writer 2030 is provided on a side of a portable terminal including a display portion 2031, and an RFID tag 2033 is provided on a side of merchandise 2032 (FIG. 12B). When the reader/writer 2030 is held up against the RFID tag 2033 of the merchandise 2032, information relating to merchandise, such as a raw material and a place of origin of the merchandise, a test result per production process, a record of distribution process, and further description of the merchandise is displayed in the display portion 2031. In addition, merchandise 2036 can be inspected by using a reader/writer 2034 and an RFID tag 2035 provided in the merchandise 2036, when the merchandise 2036 is transported by a belt conveyor (FIG. 12C). In this manner, information can be easily obtained, and a high function and a high added value are realized by utilizing an RFID tag for a system.

This embodiment mode can be implemented by being freely combined with the above embodiment modes.

Embodiment Mode 6

Figure 13:
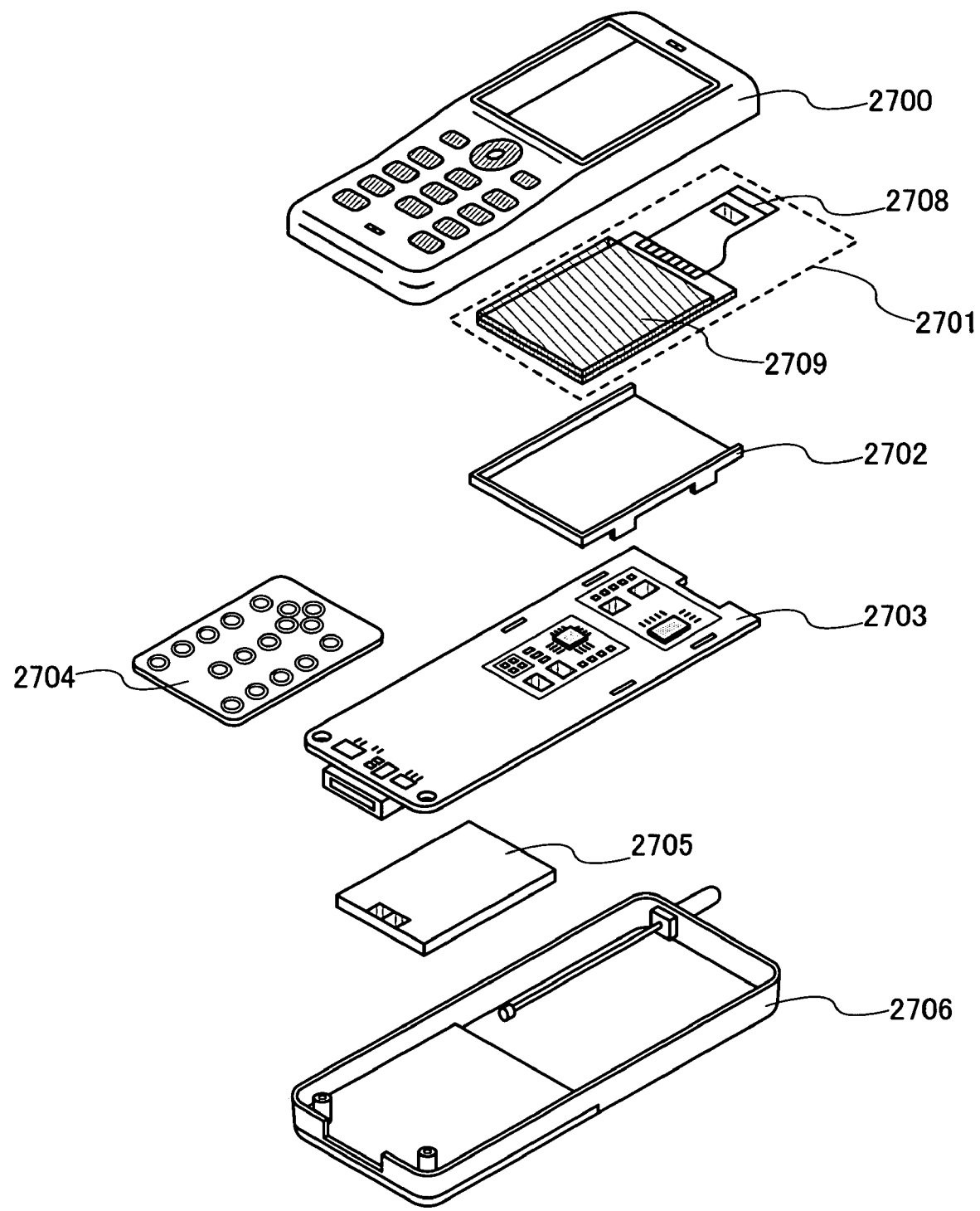
FIG. 13 is a diagram showing Embodiment Mode 6.

A semiconductor device according to the present invention can be applied in a wide field. For example, the present invention can be applied to an electronic device. The electronic device includes a television receiver, a computer, a portable information terminal such as a mobile phone, a camera such as a digital camera and a video camera, a navigation system, a projector, or the like. A case where a semiconductor device according to the present invention is applied to the mobile phone will be explained with reference to FIG. 13.

The mobile phone includes casings 2700 and 2706, a panel 2701, a housing 2702, a printed wiring board 2703, operating buttons 2704, and a battery 2705. The housing 2702 incorporating the panel 2701 so as to be freely detachable is set to the printed wiring board 2703. The form and size of the housing 2702 are appropriately changed in accordance with an electronic device incorporating the panel 2701. A plurality of packaged semiconductor devices are mounted onto the printed wiring board 2703, and a semiconductor device according to the present invention can be used as one of the semiconductor devices. Each of the plurality of semiconductor devices mounted onto the printed wiring board 2703 has any one of function of a controller, a central processing unit (CPU), a memory, a power supply circuit, an audio processing circuit, a transmitting/receiving circuit, and the like.

The panel 2701 is connected to the printed wiring board 2703 via a connecting film 2708. The panel 2701, the housing 2702, and the printed wiring board 2703 described above are contained inside the casings 2700 and 2706 together with the operating buttons 2704 and the battery 2705. A pixel region 2709 included in the panel 2701 is disposed so as to be seen from a window provided in the casing 2700.

A semiconductor device according to the present invention is compact, thin, and lightweight. Accordingly, the semiconductor device can utilize limited space inside the casings 2700 and 2706 of the electronic device effectively.

Moreover, a semiconductor device according to the present invention can also be used as an RFID tag, for example, in paper money, coins, valuable securities, certificates, bearer bonds, packing containers, books, recording media, personal items, vehicles, food items, clothes, healthcare items, living wares, medicals, electronic devices, or the like. Specific examples thereof will be explained with reference to FIGS. 14A to 14H.

Figure 14A:
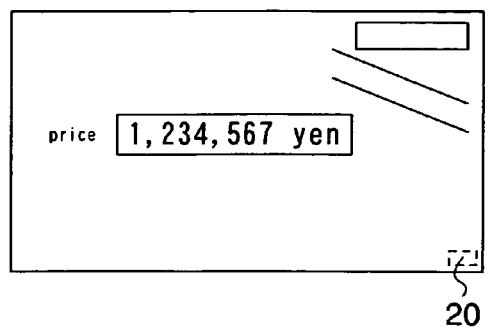
FIGS. 14A to 14H are diagrams showing Embodiment Mode 6.
Figure 14B:
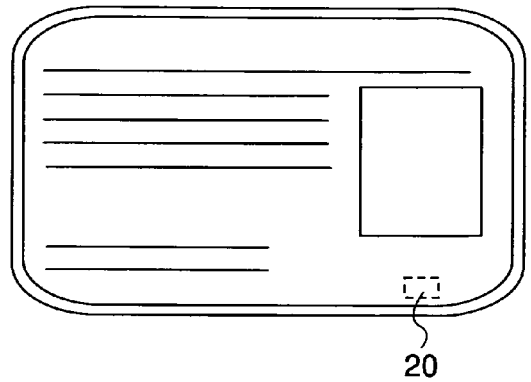
Figure 14C:
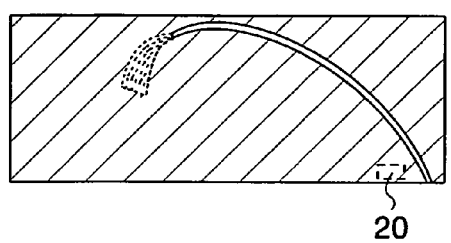
Figure 14D:
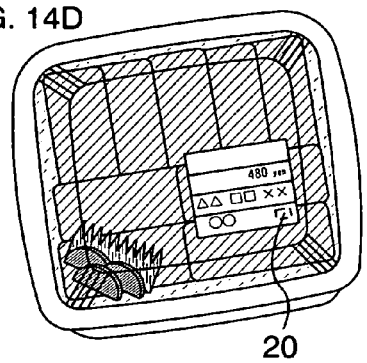
Figure 14E:
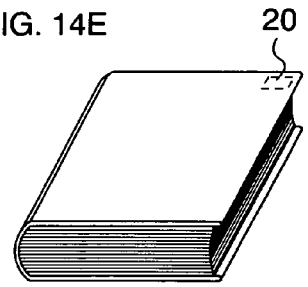
Figure 14F:
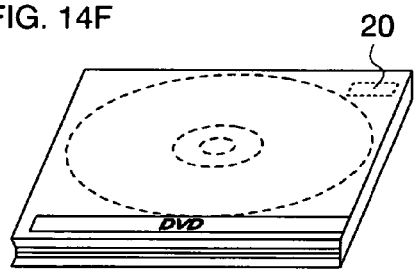
Figure 14G:
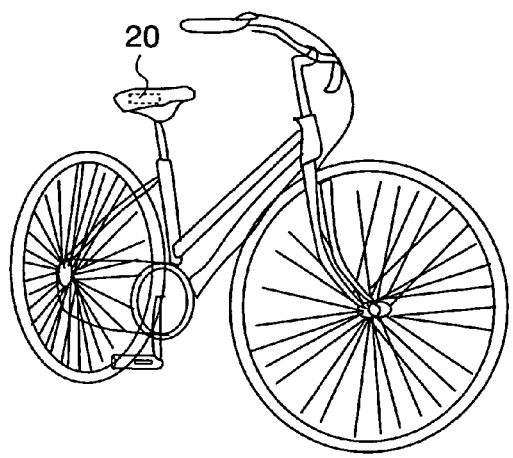
Figure 14H:
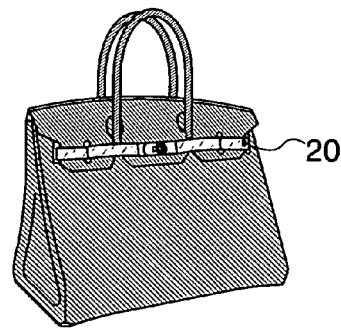

The paper money and the coins indicate currency in the market, which include a note (a cash voucher) that is a currency in a specific area, memorial coins, and the like. The valuable securities indicate a check, a stock certificate, a promissory note, and the like (FIG. 14A). The certificates indicate a driver's license, a resident card, and the like (FIG. 14B). The bearer bonds indicate a stamp, a rice coupon, various gift coupons, and the like (FIG. 14C). The packing containers indicate a wrapping paper for a lunch box or the like, a plastic bottle, and the like (FIG. 14D). The books indicate a book, a volume, and the like (FIG. 14E). The recording media indicate DVD software, a video tape, and the like (FIG. 14F). The vehicles indicate a wheeled vehicle such as a bicycle, a vessel, and the like (FIG. 14G). The personal items indicate a bag, glasses, and the like (FIG. 14H). The food items indicate groceries, beverages, and the like. The clothes indicate wear, footwear, and the like. The healthcare items indicate a medical instrument, a health appliance, and the like. The living wares indicate furniture, a lighting apparatus, and the like. The medicals indicate a medicine, an agrichemical, and the like. The electronic apparatuses indicate a liquid crystal display device, an EL display device, a television apparatus (a television receiver and a thin television receiver), a mobile phone, and the like.

By providing an RFID tag 20 for paper money, coins, valuable securities, certificates, bearer bonds, and the like, counterfeiting thereof can be prevented. In particular, by providing a wireless chip, which is for recording a previous disease or a history of taking medicine, to a health insurance card, which is a kind of certificate, and checking the health insurance card when a doctor diagnoses, even in a case of going to a plurality of hospitals, it is prevented to make a wrong diagnosis on the kind of medicines, a dose amount, or the like. In addition, by providing an RFID tag 20 for packing containers, books, recording media, personal items, food items, living wares, electronic devices, and the like, the efficiency of the inspection system, the rental system, or the like can be improved. By providing an RFID tag 20 for vehicles, healthcare items, medicals, and the like, counterfeiting and theft thereof can be prevented and the medicines can be prevented from being taken by mistake. The RFID tag 20 may be attached to a surface of an object or embedded in an object. For example, the RFID tag 20 may be embedded in paper of a book, or embedded in an organic resin of a package.

In this manner, by providing an RFID tag for packing containers, recording media, personal items, food items, clothes, living wares, electronic devices, or the like, efficiency of the inspection system, the rental system, or the like can be improved. By providing an RFID tag 20 for vehicles, counterfeiting or theft thereof can be prevented. In addition, by embedding an RFID tag 20 in a creature such as an animal, each creature can be easily identified, for example, by embedding an RFID 20 in a creature such as a domestic animal, the first year of life, sex, breed, or the like thereof can be easily identified.

As described above, a semiconductor device according to the present invention can be used by being provided to any article. This embodiment mode can be implemented by being freely combined with the above embodiment modes.

The present application is based on Japanese Patent Application serial No. 2005-158462 filed on May 31, 2005 in Japanese Patent Office, the entire contents of which are hereby incorporated by reference.

What is claimed is:

1. A method for manufacturing an antenna, comprising:
    applying a fluid containing a conductive particle over an object; and
    after forming a film containing the conductive particle by curing the fluid containing the conductive particle, forming an antenna by irradiating the film with laser.

2. A method for manufacturing an antenna according to claim 1, wherein the film containing the conductive particle is patterned by the laser irradiation.

3. A method for manufacturing an antenna according to claim 1, wherein screen printing, spin coating, dipping or a droplet discharging method is used as a method for applying the fluid containing the conductive particle.

4. A method for manufacturing an antenna according to claim 1, wherein a particle containing gold, silver, copper, an alloy of gold and silver, an alloy of gold and copper, an alloy of silver and copper, an alloy of gold, silver, and copper, indium tin oxide, conductive oxide in which 2 wt % or more and 20 wt % or less of zinc oxide is mixed in indium oxide, conductive oxide in which 2 wt % or more and 20 wt % or less of silicon oxide is mixed in indium oxide, a lead-free solder, or a solder containing lead, is used as the conductive particle.

5. A method for manufacturing an antenna according to claim 1, wherein a solid laser having a wavelength of 1 nm or more and 380 nm or less is used in the laser irradiation.

6. A method for manufacturing a semiconductor device, comprising:
    forming a separation layer over a substrate;
    forming an element layer including a thin film transistor over the separation layer;
    applying a fluid containing a conductive particle over the element layer;
    after forming a film containing the conductive particle by curing the fluid containing the conductive particle, forming an antenna being electrically connected to the thin film transistor by irradiating the film with laser;
    forming a protection layer over the element layer and the antenna;
    selectively removing the element layer and the protection layer to form an opening portion;
    separating the element layer, the antenna, and the protection layer from the substrate; and
    sealing the element layer, the antenna, and the protection layer by using a first flexible film and a second flexible film.

7. A method for manufacturing a semiconductor device according to claim 6, wherein the film containing the conductive particle is patterned by the laser irradiation.

8. A method for manufacturing a semiconductor device according the claim 6, wherein screen printing, spin coating, dipping or a droplet discharging method is used as a method for applying the fluid containing the conductive particle.

9. A method for manufacturing a semiconductor device according to claim 6, wherein a particle containing gold, silver, copper, an alloy of gold and silver, an alloy of gold and copper, an alloy of silver and copper, an alloy of gold, silver, and copper, indium tin oxide, conductive oxide in which 2 wt % or more and 20 wt % or less of zinc oxide is mixed in indium oxide, conductive oxide in which 2 wt % or more and 20 wt % or less of silicon oxide is mixed in indium oxide, a lead-free solder, or a solder containing lead, is used as the conductive particle.

10. A method for manufacturing a semiconductor device, comprising:
    forming a separation layer over a substrate;
    forming an element layer including a thin film transistor over the separation layer;
    forming a conductive film over the element layer;
    after forming the conductive film, forming an antenna being electrically connected to the thin film transistor by irradiating the conductive film with laser;
    forming a protection layer over the element layer and the antenna;
    selectively removing the element layer and the protection layer to form an opening portion;
    separating the element layer, the antenna, and the protection layer from the substrate; and
    sealing the element layer, the antenna, and the protection layer by using a first flexible film and a second flexible film.

11. A method for manufacturing a semiconductor device according to claim 10, wherein the conductive film is patterned by the laser irradiation.

12. A method for manufacturing a semiconductor device according to claim 10, wherein the conductive film is formed by CVD, sputtering, plating, or evaporation.

13. A method for manufacturing a semiconductor device according to claim 10, wherein a solid laser having a wavelength of 1 nm or more and 380 nm or less is used in the laser irradiation.

* * * * *